United States Patent
Gray et al.

(10) Patent No.: US 9,793,829 B2
(45) Date of Patent: Oct. 17, 2017

(54) MAGNETO-THERMOELECTRIC GENERATOR FOR ENERGY HARVESTING

(71) Applicant: Prime Photonics, LC, Blacksburg, VA (US)

(72) Inventors: David Todd Gray, Blacksburg, VA (US); John Moore Coggin, Blacksburg, VA (US)

(73) Assignee: Prime Photonics, LC, Blacksburg, VA (US)

( * ) Notice: Subject to any disclaimer, the term of this patent is extended or adjusted under 35 U.S.C. 154(b) by 406 days.

(21) Appl. No.: 14/487,567

(22) Filed: Sep. 16, 2014

(65) Prior Publication Data

US 2015/0083196 A1 Mar. 26, 2015

Related U.S. Application Data

(60) Provisional application No. 61/882,355, filed on Sep. 25, 2013.

(51) Int. Cl.
*H02N 2/18* (2006.01)
*H01L 31/054* (2014.01)

(52) U.S. Cl.
CPC ........... *H02N 2/18* (2013.01); *H01L 31/0547* (2014.12)

(58) Field of Classification Search
CPC ....................................................... H02N 2/18
(Continued)

(56) References Cited

U.S. PATENT DOCUMENTS 3,664,881 A    5/1972 Love
5,644,184 A *  7/1997 Kucherov ............... F25B 21/00
                                                    310/306

(Continued)

FOREIGN PATENT DOCUMENTS

WO    2007087383 A2    8/2007

OTHER PUBLICATIONS

Elliott, J.F. et al., "Some magnetic properties of gadolinium metal," Physical Review, vol. 91, No. 1, 1953, pp. 28-30.
(Continued)

*Primary Examiner* — J. San Martin
(74) *Attorney, Agent, or Firm* — New River Valley IP Law, PC; Michele L. Mayberry; Timothy D. Nolan

(57) ABSTRACT

Provided is a magneto-thermoelectric generator (MTG) device for energy harvesting and more particularly a device for converting waste thermal heat from a photovoltaic cell into mechanical energy and ultimately into electrical energy. Embodiments operate on the principle of thermally-induced switching between open and closed states of a ferromagnetic switch to generate mechanical oscillations that cause strain in a piezoelectric material, resulting in the generation of electrical energy. A structure capable of providing a non-linear restoring force provides mechanical energy to the device, which is a significant improvement over prior art MTG devices employing a linear spring restorative force. The device is also provided as a hybrid photovoltaic (PV)/MTG energy harvester for scavenging heat from photovoltaic cells. The hybrid PV/MTG device is particularly useful for harvesting waste heat to boost power generation, extend flight duration, and provide thermal management aboard HALE platforms.

28 Claims, 34 Drawing Sheets

(58) Field of Classification Search
USPC ............ 310/339, 306, 307; 290/1 R; 60/257, 60/528
See application file for complete search history.

(56) References Cited

U.S. PATENT DOCUMENTS

| | | | | |
|---|---|---|---|---|
| 6,975,060 | B2* | 12/2005 | Styblo | H02N 2/18 310/306 |
| 7,800,278 | B2 | 9/2010 | Ujihara et al. | |
| 8,188,622 | B1* | 5/2012 | Waters | H02K 35/04 290/1 R |
| 8,519,595 | B2* | 8/2013 | Hunter | H01L 37/02 310/305 |
| 8,878,418 | B2* | 11/2014 | Descure | H02N 2/18 310/306 |
| 8,969,717 | B2* | 3/2015 | Sager | H02N 10/00 136/259 |
| 9,444,371 | B2* | 9/2016 | Ollier | H01L 41/047 |
| 2005/0205125 | A1* | 9/2005 | Nersessian | H02N 2/18 136/205 |
| 2007/0205854 | A1 | 9/2007 | Kazadi | |
| 2009/0315335 | A1* | 12/2009 | Ujihara | F03G 7/065 290/1 R |
| 2011/0203573 | A1* | 8/2011 | Hollis | F24J 2/07 126/595 |
| 2013/0141091 | A1 | 6/2013 | Delaet et al. | |
| 2014/0285061 | A1* | 9/2014 | McKinley | H01L 37/02 310/306 |
| 2015/0084480 | A1* | 3/2015 | Savelli | H01L 41/0831 310/300 |
| 2016/0006373 | A1* | 1/2016 | Conard | F03G 7/065 310/306 |

OTHER PUBLICATIONS

Gedik, E. et al., "Magnetic Refrigeration technology applications on near-room temperature," 5th International Advanced Technologies Symposium (IAST'09), May 13-15, 2009, Karabuk, Turkey, 7 pages.

Krylov, S. et al., "Bistability of curved microbeams actuated by fringing electrostatic fields," Nonlinear Dynamics, vol. 66 No. 3, 2011, pp. 403-426.

Nigh, H. E. et al., "Magnetization and electrical resistivity of gadolinium single crystals," Physical Review vol. 132, No. 3, 1963, pp. 1092-1097.

Ponomarev, B. K., "Magnetic properties of gadolinium in the region of the paraprocess," J. Magnetism and Magnetic Materials 61 (1986), pp. 129-138.

Radziemska, E., "Performance Analysis of a Photovoltaic-Thermal Integrated System" International Journal of Photoenergy, vol. 2009 (2009), 6 pages.

Royne, A. et al., "Cooling of photovoltaic cells under concentrated illumination: a critical review", Solar Energy Materials and Solar Cells 86 (2005), pp. 451-483.

Thilak, Adiboina, "Solar Photovoltaic (PV) Supply Chain—Global Market Size and Company Analysis of Polysilicon, Wafers, PV Cells and Solar PV Modules to 2015", RenewableEnergyWorld. com, Feb. 1, 2011, 5 pages.

Ujihara, M. and Carman, G. P., "Thermal energy harvesting device using ferromagnetic materials", Appl. Phys. Lett. vol. 91, 093508 (2007), 3 pages.

A. Yu et al., "Graphite Nanoplatelet-Epoxy Composite Thermal Interface Materials," J. Phys. Chem. C, vol. 111, No. 21, p. 7565-7569, 2007, 5 pages.

B. Yang and Q. Lin, "Planar micro-check valves exploiting large polymer compliance," Sensors and Actuators A, No. 134, p. 186-193, 2007.

C. Zhao and T. Lu, "Analysis of microchannel heat sinks for electronics cooling," International Journal of Heat and Mass Transfer, No. 45, pp. 4857-4869, 2002.

D. D. L. Chung, "Thermal interface materials," Journal of Materials Engineering and Performance, vol. 10, No. 1, pp. 56-59, 2001.

F. K. Forster et al., "Designing High-Performance Micro-Pumps Based on No-Moving Parts Valves," MEMS DSC, vol. 62, pp. 47-53, 1997.

F. K. Forster, R. L. Bardell, N. R. Sharma, R. J. Penney and M. A. Afromowitz, "Transport of Particle-Laden Fluids Through Fixed-Valve Micropumps," MEMS, vol. 1, 1999.

M. Mochizuki, Y. Sajtoy, T. Nguyen, T. Nguyen, V. Wuttijumnong, Y. Horiuchi, R. Tacomkang, R. Singh and A. Akbarzadeh, "Development of miniature loop heat pipes for the thermal control of laptops," in ASME 2008 First International Conference on Micro/Nanoscale Heat Transfer, Tainan, Taiwan, Jan. 6-9, 2008.

M. Ujihara, G. Carman, D. Lee, "Thermal energy harvesting device using ferromagnetic materials," Applied Physics Letters, vol. 91, No. 9, p. 093508, 2007.

R. Rullière et al., "Prediction of the maximum heat transfer capability of two-phase heat spreaders—Experimental validation," International Journal of Heat and Mass Transfer, vol. 50, No. 7-8, p. 1255-1262, 2007, 8 pages.

R. Singh, A. Akbarzadeh, and M. Mochizuki, "Thermal Potential of Flat Evaporator Miniature Loop Heat Pipes for Notebook Cooling," IEEE Transactions on Components and Packaging Technologies, vol. 33, No. 1, Mar. 2010, pp. 32-45.

S. H. Winoto, "A New No Moving Parts Micro Valve," Engineering Research, National University of Singapore, vol. 25, No. 1, 2010.

S. V. Garimella, A. S. Fleisher, J. Y. Murthy, A. Keshavarzi and R. Prasher, "Thermal Challenges in Next-Generation Electronic Systems," IEEE Components, Packaging, and Manufacturing Technology Society, vol. 31, No. 4, pp. 801-815, 2008.

S.C. Wu et al., "Investigation of the effect of heat leak in loop heat pipes with flat evaporator," in Microsystems, Packaging, Assembly and Circuits Technology Conference, Taipei, 2009, 4 pages.

Thermacore, Inc., "Heat Pipe Technology: Passive Heat Transfer for Greater Efficiency," 2012. [Online]. Available: http://www.thermacore.com/thermal-basics/heat-pipe-technology.aspx. [Accessed Jun. 2012].

V. Pastukhov et al., "Miniature loop heat pipes for electronics cooling," Applied Thermal Engineering, No. 23, pp. 1125-1135, 2003, 11 pages.

* cited by examiner the present invention is related to magneto-thermoelectric generator devices with improved mechanical energy that can be used to harvest waste heat.

MAGNETO-THERMOELECTRIC GENERATOR FOR ENERGY HARVESTING

CROSS-REFERENCE TO RELATED APPLICATIONS

The present application relies on the disclosure of and claims priority to and the benefit of the filing date of U.S. Provisional Application No. 61/882,355, filed Sep. 25, 2013, the disclosure of which is hereby incorporated by reference herein in its entirety.

BACKGROUND OF THE INVENTION

Field of the Invention

The present invention is related to magneto-thermoelectric generator devices. More particularly, the present invention is related to magneto-thermoelectric generator devices with improved mechanical energy that can be used to harvest waste heat.

Description of Related Art

Many inventions and significant research show the vast efforts to meaningfully harvest waste thermal energy. In some cases, excess thermal energy is simply removed to provide for lower operational temperatures of systems or components. This active cooling can sometimes achieve a net gain in system efficiency (e.g. active cooling of concentrated solar cells), but ultimately requires the input of adequate energy to move a cooling fluid. Other research has focused on the conversion of thermal energy into electrical energy that may be used instantaneously, or stored in batteries or capacitors for later use. Thermoelectric Peltier or Seebeck effect devices operate to harvest electricity from thermal gradients, as do magnetothermoelectric generators.

Photovoltaic (PV) power is increasingly gaining a greater share as a source of power production in developed countries, and is becoming a principal source of power for Unmanned Aerial Vehicles (UAVs), particularly those requiring long durations of flight such as High Altitude Long Endurance (HALE) air vehicles. HALE air vehicles have the potential to meet a long standing need for both military and non-military operations where persistent intelligence, surveillance, and reconnaissance (ISR) capabilities are required. Military operators need a reliable capability which can be quickly deployed to emerging theatres, and commercial operators desire these long endurance platforms for communication hubs and environmental monitoring. In recent years the enabling technologies required for solar powered High Altitude Long Endurance (HALE) air vehicles have matured to where missions requiring months to years of flight duration, such as the DARPA Vulture and the Air Force ISIS, are becoming feasible.

HALE platforms come in various shapes and sizes ranging from small hand-launched unmanned aerial systems (UAS's) such as the AF Solar Raven to very large high aspect ratio aircraft such as NASA's Helios to Lighter than Air (LTA) vehicles such as the Air Force ISIS, Lockheed Martin's High Altitude Airship (HAA), or the Army's Long-Endurance Multi-Intelligence Vehicle (LEMV). One thing most of these vehicles have in common is that they will utilize solar cells to achieve long times on station. However, energy production remains the limiting factor to achieving payload and longer endurance. Additional energy in the form of heat is available on these vehicles due to PV cells, high power RF, propulsion systems, and energy storage to name the most common. Thus, thermal management aboard these vehicles is becoming more critical as high power payloads become standard. In addition, PV power production is limited by temperature-dependent reductions in efficiency of photovoltaic cells. Thus, a device that can scavenge heat from a PV cell and convert it to electrical energy can significantly improve power to the overall system.

Previously, Ujihara and colleagues described an energy harvesting apparatus that may include a ferromagnetic material and/or a shape memory alloy to convert thermal energy to mechanical energy to electrical energy (U.S. Pat. No. 7,800,278 (see also International Patent Application Publication No. WO2007/087383), which patent and publication are incorporated by reference herein in their entireties). The apparatus is subjected to a thermal gradient to cause beams to bend thus creating stress/strain in a piezoelectric material. However, for such a system, the output power is the product of the mechanical energy, the operational frequency, and the mechanical to electrical conversion of the harvesting springs. Additionally, others have described devices for converting heat to electrical energy, but which do not entertain an intermediate conversion step of converting the thermal energy to mechanical energy, such as is disclosed in U.S. Pat. No. 3,664,881, which patent is incorporated by reference herein in its entirety.

Thus, any improvement in mechanical energy of such systems will result in a proportional increase in power output. To date, there remains a need for improvement in the power output of magnetothermoelectric generators as well as a need for applications of magnetothermoelectric generators for converting waste heat from photovoltaic cells into power.

SUMMARY OF THE INVENTION

The present invention addresses these issues with an innovative new magneto-thermoelectric (MTG) device for converting scavenged waste heat into electrical energy. The present invention converts excess thermal energy into mechanical oscillations and subsequently generates electrical energy from the oscillations through an efficient mechanical-to-electrical conversion mechanism. A device relying on similar principles is disclosed for use as a fluid pump in U.S. Provisional Application No. 61/835,882, filed Jun. 17, 2013, which application is incorporated by reference herein in its entirety.

The device of the invention leverages changes in magnetic properties of certain magnetic materials which herein may be called "temperature-dependent magnetic materials." As used herein, a "temperature-dependent magnetic material" is any magnetic material having a thermal transition wherein the amplitude or the direction of the magnetic moment changes as a function of temperature. Further, the MTG device can employ any magnetic transition that results in a change in the vector nature of the magnetic moment of the magnetic material. Some examples of these magnetic transitions may include exchange bias coupled materials (as used with magnetic storage media) consisting of a ferromagnetic and an antiferromagnetic layer, spin reorientation via antiferromagnetic coupling, ferromagnetic-paramagnetic transition, antiferromagnetic-to-paramagnetic Neel transition, or ferrimagnetic transition across magnetic compensation point.

The MTG device operation is based on thermally-induced magnetic moment change within a magnetic material with a transition temperature between that of the heat source and of the cold sink as well as a means for non-linear restoring force (which may also be referred to interchangeably herein as a "structure capable of providing a non-linear restoring force") which may be a nonlinear spring that is coupled to a ferromagnet, for example. When the system is cool, the magnetic material will be in the closed position, i.e. in thermal contact with the hot side hard magnet. As the heat from the source conducts into the magnetic material, it will approach its transition temperature and experience a change in the magnitude or direction of its magnetization. With the opposing magnetic force weakened, the means for non-linear restoring force returns the magnetic material to the cold side of the device. Upon sufficient heat transfer to the cold side, the magnetic moment will return to its original state, returning the material to its hot side position. The movement of the magnetic material between the hot side and cold side causes mechanical oscillations, which are one form of a non-linear restoring force. Electrical power is generated by coupling the means for non-linear restoring force with a piezoelectric material that results in electromechanical production of electrical energy. Implementation of the means for non-linear restoring force represents a significant improvement over prior art MTG devices as it provides 10-fold more mechanical energy than MTG devices employing a linear spring restorative force.

The MTG device of the invention may be used in numerous applications—from large scale waste heat recovery to small-scale, self-powered sensors. Further, the MTG device of the invention is useful for multi-modal energy harvesting, such as thermal, vibrational, and photovoltaic scavenging. The MTG device is particularly useful for harvesting waste heat to boost power generation, extend flight duration, and provide thermal management aboard HALE platforms.

In embodiments, a MTG device is provided comprising a means for non-linear restoring force, wherein the means for non-linear restoring force is a nonlinear spring with a single magnetostrictive layer with a positive magnetostrictive coefficient.

The present invention further provides a MTG device comprising a means for nonlinear restorative force, wherein the means for non-linear restoring force is a non-linear spring comprising a laminate of layers with one or more magnetostrictive coefficients.

A MTG device is also provided that comprises a means for non-linear restorative force, wherein the means for non-linear restoring force is a non-linear spring provided as a laminate with a piezoelectric layer.

Exemplary embodiments of the invention provide a MTG device comprising a means for non-linear restorative force, wherein the means for non-linear restoring force is a non-linear spring comprising magnetostrictive materials.

Additionally provided is a MTG device comprising means for non-linear restorative force, wherein the means for non-linear restoring force is a non-linear ferromagnetic spring.

Specific embodiments of the invention, for example, provide for a MTG device comprising one or more of the following components: (a) a topside magnetic circuit; (b) a heat source; (c) a low density bridge; (d) a soft magnet; (e) a piezoelectric layer; (f) means for nonlinear restoring force; (g) a spring housing; (h) a nonlinear return circuit; (i) a heat sink; and (j) a base. In embodiments, such components can be present in and arranged within the device, for example, in the order listed from the top to the bottom of the device. For example, the heat source can be provided by the device itself or more commonly the device can be disposed near and in operable communication with a heat source such that during use the device extracts heat from the heat source for use in generating electrical energy. Embodiments may additionally or alternatively comprise a shape memory component, such as a shape memory alloy, however, in preferred embodiments of the MTG there is no shape memory component.

It is noted that in embodiments, the heat source may be any source of heat, but preferably is a source of waste heat, including but not limited to, a photovoltaic cell. Also provided is a MTG device comprising a photovoltaic cell as a source of waste heat.

Another aspect of the invention is a MTG device comprising one or more of following components: (a) a photovoltaic (PV) cell; (b) a heat spreader and magnetic backing layer; (c) a magnetic circuit; (d) a tuned ferromagnet; (e) a piezoelectric layer; (f) a spacer; (g) means for non-linear restoring force; and (h) a cold sink. These components can be arranged in the device in the order listed, for example, from the top to the bottom of the device.

In another exemplary embodiment, the present invention provides a MTG device, comprising (which can be arranged from top to bottom) one or more of the following: (a) a heat source; (b) a magnetic circuit; (c) a ferromagnetic material; (d) a piezoelectric material; (e) a means for nonlinear restorative force; and (g) a heat sink; wherein said magnetic circuit is positioned proximal to said heat source; wherein said heat source and heat sink provide a thermal gradient comprising a hot side and a cold side; wherein said means for non-linear restorative force and said piezoelectric material are provided as successive layers adjacent to one another; wherein said ferromagnetic material: (1) has a thermally induced magnetic transition point within or near temperatures included in said thermal gradient; (2) is in communication with said successive layers of said means for non-linear restorative force and said piezoelectric material; (3) with said means for non-linear restorative force and said piezoelectric material, is capable of oscillating during use between a closed position and an open position by: (i) binding to said magnetic circuit at temperatures below its magnetic transition point through an attractive magnetic force to achieve a closed position; and (ii) unbinding to said magnetic circuit at temperatures above its magnetic transition point through a restorative force provided by said means for non-linear restorative force to achieve an open position; and wherein said oscillations provide mechanical energy to said piezoelectric material during use, resulting in conversion of said mechanical energy to electrical energy.

In another exemplary embodiment of a MTG device according to the invention, the heat source is a waste thermal energy source.

In yet other embodiments of a MTG device according to the invention, the waste thermal energy source is a photovoltaic cell.

In MTG device embodiments according to the invention, the magnetic circuit can comprise for example one or more of NdFeCo, NdFeB, AlNiCo and SmCo.

Exemplary embodiments of a MTG device according to the invention also include such devices wherein the ferromagnetic material comprises a soft magnet.

In another exemplary embodiment of a MTG device according to the invention, the ferromagnetic material comprises one or more of gadolinium, thin-film $La_{1-x}Sr_xMnO_3$ (LSMO) ceramics, powdered cobalt-rich metallic glasses, Fe—Ni, Non-Oriented Si—Fe, MnZnFeO, $Gd_5(Si_xGe_{1-x})_4$, $Gd_5(Si_{1.985}Ge_{1.985}Ga_{0.03})_2$, $Ni_{52.6}Mn_{23.1}Ga_{24.5}MnAs$, $MnAs_{0.9}Sb_{0.1}$, $MnFeP_{0.45}As_{0.35}$, $La_{1-x}Ca_xMnO_3$, or $La_xM_ySr_{0.2}MnO_3$ (LSMO).

A MTG device according to the invention can also be configured to comprise a ferromagnetic material that is synthesized through thin-film deposition.

The means for non-linear restorative force can be a ferrous spring or a magnetoelectric spring in any of the MTG embodiments of the invention.

In another exemplary embodiment of a MTG device according to the invention, the magnetoelectric spring comprises one or more magnetostrictive layers.

Still further, a MTG device according to the invention can comprise one or more magnetoelectric springs comprising a single magnetostrictive layer with a positive magnetostriction coefficient.

In yet another exemplary embodiment of a MTG device according to the invention, the magnetoelectric spring comprises a laminate of magnetostrictive layers with different magnetostrictive coefficients.

Further, for example, a MTG device according to embodiments of the invention can comprise one or more magnetoelectric spring with one or more magnetostrictive layer(s) comprising nickel-zinc ferrite (NZF) and/or nickel.

Additionally, the MTG devices can comprise one or more magnetoelectric spring with one or more magnetostrictive layer(s) of terbium (Te), dysprosium (Dy), TERFENOL-D (terbium-iron-dysprosium), Galfenol (gallium-iron), and/or METGLAS 2605SC.

According to further embodiments of the invention, the piezoelectric material is applied to the one or more magnetostrictive layers. Still further, the MTG device according to the invention can comprise piezoelectric material that is applied through spin coating or 3-D aerosol jet deposition.

In another exemplary embodiment of a MTG device according to the invention, the piezoelectric material is a lead ceramic. For example, in embodiments a MTG device is provided wherein the lead ceramic is any or any combination of PZT, PLZT, PMNT, PMNZ, and/or PFW. Preferred are MTG devices wherein the lead ceramic is PZT.

Even further, a MTG device according to the invention can comprise piezoelectric material that is any or any combination of barium titanate, potassium niobate, lithium niobate, lithium tantalate, sodium tungstate, PVDF and/or PVC.

In another exemplary embodiment of a MTG device according to the invention, a heat spreader layer is provided between said photovoltaic cell and said magnetic circuit.

A MTG device according to the invention can be provided with a backside non-linear return circuit between said means for non-linear restorative force and said heat sink.

Another example of a MTG device according to the invention can be configured such that the non-linear restorative force is arranged between the piezoelectric material and the ferromagnetic material.

MTG devices according to embodiments of the invention can be operably configured to operate as hybrid PV/MTG energy harvesters.

BRIEF DESCRIPTION OF THE DRAWINGS

(FIG. 25A) Plane view, (FIG. 25B) Cross-sectional view.

DETAILED DESCRIPTION OF VARIOUS EMBODIMENTS OF THE INVENTION

Reference will now be made in detail to various exemplary embodiments of the invention. Embodiments described in the description and shown in the figures are illustrative only and are not intended to limit the scope of the invention, and changes may be made in the specific embodiments described in this specification and accompanying drawings that a person of ordinary skill in the art will recognize are within the scope and spirit of the invention.

Figure 1:
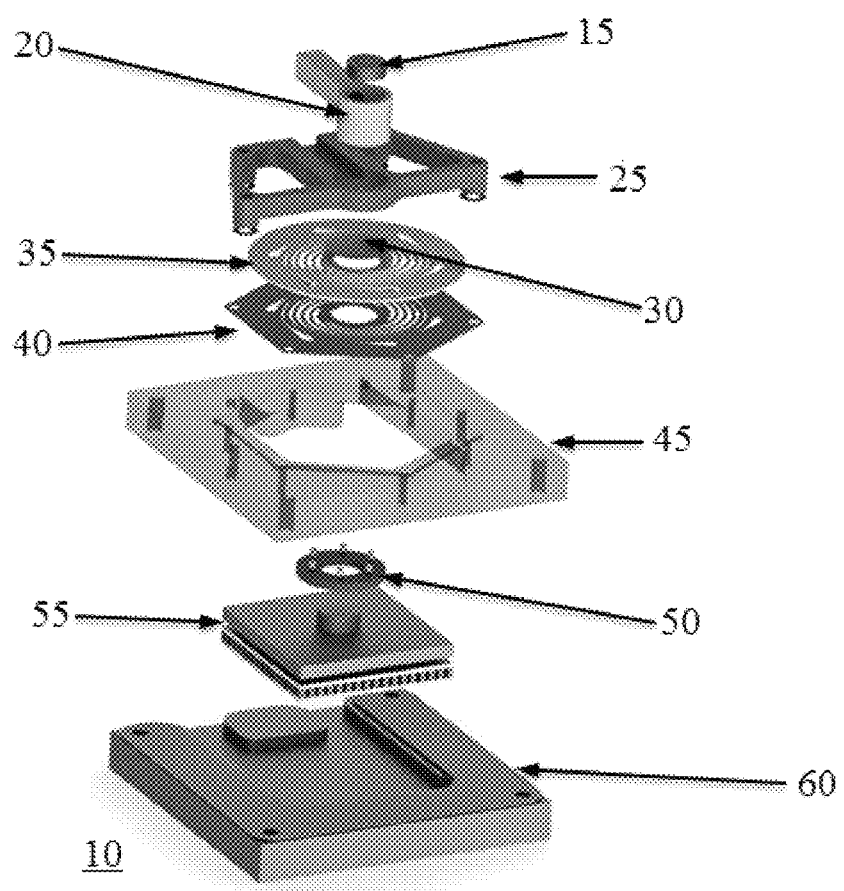
FIG. 1 is a schematic diagram showing an embodiment of a MTG device according to the invention.

FIG. 1 shows an embodiment of a MTG device according to the invention. The following describes the arrangement of the components of the embodiment shown in FIG. 1 from top to bottom. It is noted that in the context of this specification, although the components may be arranged in a particular order for purposes of demonstrating representative devices and systems of the invention, the components can be arranged in any other order to meet the specific needs of certain applications. Likewise, not all components may be needed for a particular application. The MTG device 10 includes, starting at the top of the device, a topside magnetic circuit 15. This is followed by a heat source 20 which sits between the topside magnetic circuit 15 and a low density bridge 25. Below the low density bridge 25, a piezoelectric layer 35 is sandwiched between a soft magnet 30 and a means for non-linear restoring force, which may be a ferrous spring 40, which sits on top of a low density spring housing 45. Below the low density spring housing 45, a backside nonlinear return circuit 50 sits upon a heat sink 55, which is directly supported by a base 60 on the bottom of the MTG device.

Figure 2:
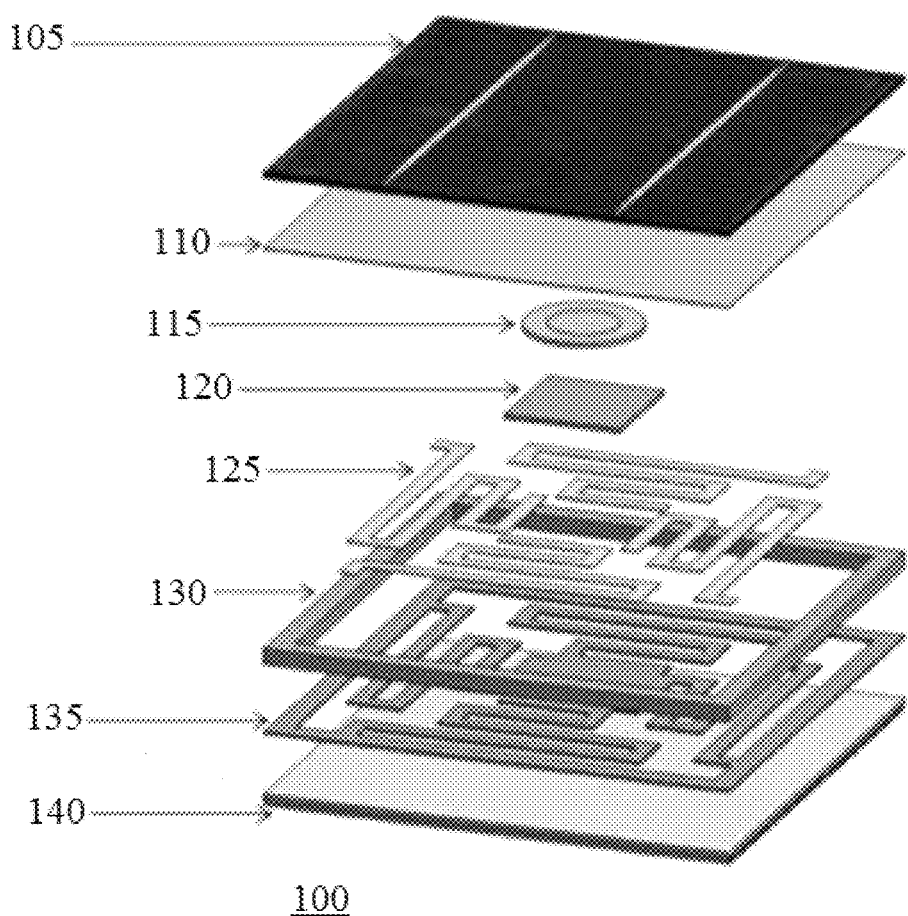
FIG. 2 is a schematic diagram showing another embodiment of a MTG device according to the invention.

FIG. 2 shows another embodiment of a MTG device according to the invention. The following describes the arrangement of the components shown in FIG. 2 from top to bottom. The MTG device 100 includes, starting at the top of the device, a photovoltaic (PV) cell 105, which serves as a heat source and sits on top of a heat spreader and magnetic backing layer 110. The MTG device further comprises a magnetic circuit 115 which is positioned on top of a tuned ferromagnet 120. Below the tuned ferromagnet 120, an aerosol deposited piezoelectric layer 125 sits on top of a spacer 130, which acts as an insulator between the piezoelectric layer 125 and a means for non-linear restoring force, which may be a magnetoelectric spring or springs 135. An aluminum microfilm 140 sits below the magnetoelectric spring(s) and acts as a cold sink.

In exemplary embodiments of the MTG device, such as those shown in FIG. 1 and FIG. 2, the magnetic circuit 15, 115 is positioned proximal to the heat source 20, 105, and the heat source 20, 105 and heat sink 55, 135 provide a thermal gradient within the MTG device comprising a hot side and a cold side. Further, the means for non-linear restorative force (which may be a ferrous spring 40 or magnetoelectric springs 135) and said piezoelectric material 35, 125 are provided as successive layers adjacent to one another. In exemplary embodiments the ferromagnetic material (which may be a soft magnet 30 or a tuned ferromagnet 120) has a thermally induced magnetic transition point within or near temperatures included in the thermal gradient provided by the heat source 20, 105 and heat sink 55, 140, and is positioned between the heat source 20, 105 and said heat sink 55, 140, and is in communication with the successive layers of the means for non-linear restorative force 40, 135 and said piezoelectric material 35, 125, such as would occur as the result of providing these materials in a sandwich configuration wherein the piezoelectric material 35, 125 is positioned between the ferromagnetic material 30, 120 and the means for non-linear restorative force 40, 135. In addition, in exemplary embodiments, the ferromagnetic material 30, 120, means for non-linear restorative force 40, 135, and said piezoelectric material 35, 125, which may be provided in a sandwich configuration as described and depicted herein, oscillate between a closed position and an open position by binding to the magnetic circuit 15, 115 at temperatures below the magnetic transition point of the ferromagnetic material 30, 120 through an attractive magnetic force to achieve a closed position and unbinding to said magnetic circuit 15, 115 at temperatures above its magnetic transition point through a restorative force provided by said means for non-linear restorative force 40, 135 to achieve an open position. In exemplary embodiments, the oscillations between an open position and closed position provide mechanical energy to said piezoelectric material 35, 125, resulting in conversion of said mechanical energy to electrical energy.

Other exemplary embodiments of the MTG device will be apparent to a skilled artisan. For example, the scope of the invention includes embodiments wherein the components of the MTG device are arranged in a different order. More specifically, for example, in some embodiments, the means for non-linear restorative force may be arranged between the piezoelectric material and the ferromagnetic material. The scope of the invention includes any order of components that will result in oscillation of the piezoelectric material and conversion of mechanical energy to electrical energy.

In exemplary embodiments such as the embodiment shown in FIG. 2, the components of the MTG device of the invention may be fabricated through scalable MEMS fabrication (microfabrication), particularly through 3D aerosol printing for scalable and volume production. The components of the MTG device may be manufactured through any known microfabrication process, including but not limited to lithography, chemical etching, masking, and thin film deposition. As shown in the exemplary embodiment depicted in FIG. 2, a MTG device manufactured through microfabrication techniques will typically have a low profile that may be less than 5 mm. In other exemplary embodiments, the profile may be less than 4, 3, 2, or even 1 mm. The small scale of the device results in an increase in specific power generated by the device. In exemplary embodiments, the components of the device are sufficiently thin that they may be assembled in a layered configuration as shown in FIG. 2.

The tunable soft magnet 120 of the microfabricated MTG device, as shown in the exemplary embodiment of FIG. 2, is designed to enhance magnetic force and enable tunable temperature. In addition, implementation of the magnetic circuit 115 overcomes shape demagnetization for thin films, and the non-linear spring 135 provides 10× more mechanical energy than a linear version. The hybrid magnetostrictive 135/piezoelectric 125 laminate maximizes mechanical to electrical conversion in the MTG device 100.

The exemplary embodiment shown in FIG. 2 is designed to maximize thermal to electrical conversion from the available thermal gradient behind PV cells, and has several technological advantages over the prior art. In a preferred embodiment, the MTG device shown in FIG. 2 is provided at a weight and with scalable fabrication suitable for large arrays aboard solar air vehicles. In this embodiment, the MTG device is multifunctional in providing additional energy per unit weight while also substituting for traditional honeycomb support structures required for packaged PVs. This embodiment of the MTG device is provided as a particularly light-weight device which results in excellent specific power for air-vehicle applications. Further, this embodiment may be provided as a PV backplane which results in additional thermal harvesting, resulting in higher effective efficiency for the Hybrid MTG/PV. Further, this embodiment has optimized thermal to mechanical conversion and high energy density magnetostrictive/PZT mechanical-to-electrical conversion, and may operate over a wide range of temperatures and with very small thermal gradient. Further, this embodiment of the MTG device may be incorporated into current PV platforms of all shapes and sizes. In addition, this embodiment may have efficient thermal-to-mechanical conversion through maximum magnetic force and thermal transfer. High specific power allows for a host of thermal scavenging and thermal management applications. Further, Dopant controlled Curie temperature of soft-magnetic components allows this embodiment to be configured for optimal operation over a wide range of temperatures.

Figures 3A, 3B:
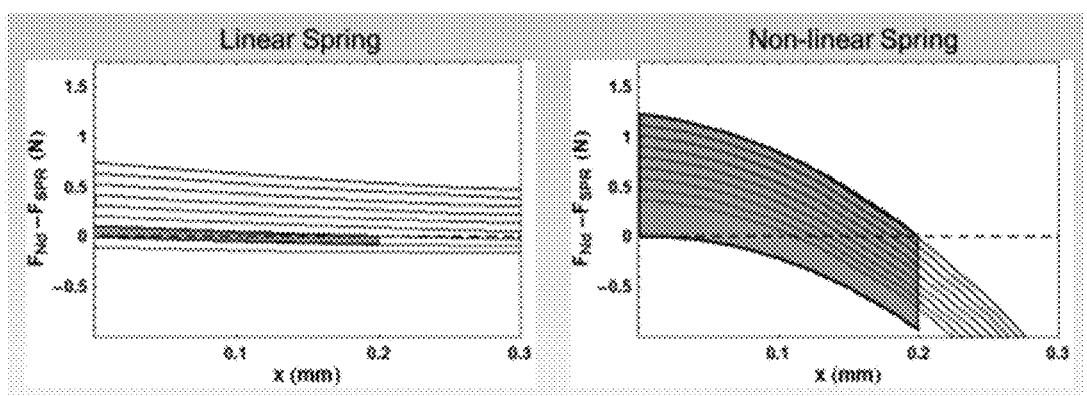
FIGS. 3A and 3B are graphs showing net force (magnetic—spring) with a linear and a nonlinear spring dynamic, where the energy under the curve represents the mechanical energy in the system and where the nonlinear spring allows for roughly a 10× increase in mechanical energy over a linear spring.

FIGS. 3A and 3B are graphs showing predicted increases in energy as a result of using a non-linear spring in comparison to a linear spring. In particular, as shown is net force as a function of spacing and temperature for a linear spring configuration (FIG. 3A), and for a nonlinear spring configuration (FIG. 3B). The ferromagnet with the linear spring oscillated between 32° C. and 28° C., as defined by the spring constant (200 N/m), spring preload (1.36 mN), and gap (0.2 mm). For the nonlinear spring, the temperature oscillates between 32° C. and 4° C., the values of which are completely determined by spring design. The devices and systems of the invention can be configured to operate under any desired temperature range and may be dependent on the particular end use and/or materials used in the device. One of skill in the art will know how to select certain materials for a desired purpose.

Figures 4A, 4B:
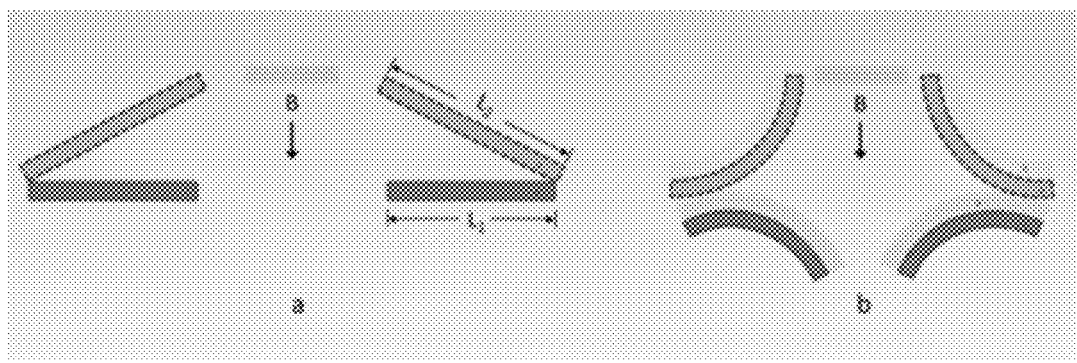
FIGS. 4A and 4B are schematic diagrams of embodiments of nonlinear springs showing a single magnetostrictive layer with a positive magnetostriction coefficient (FIG. 4A) and a laminate of layers with different magnetostrictive coefficients (FIG. 4B).
Figure 5:
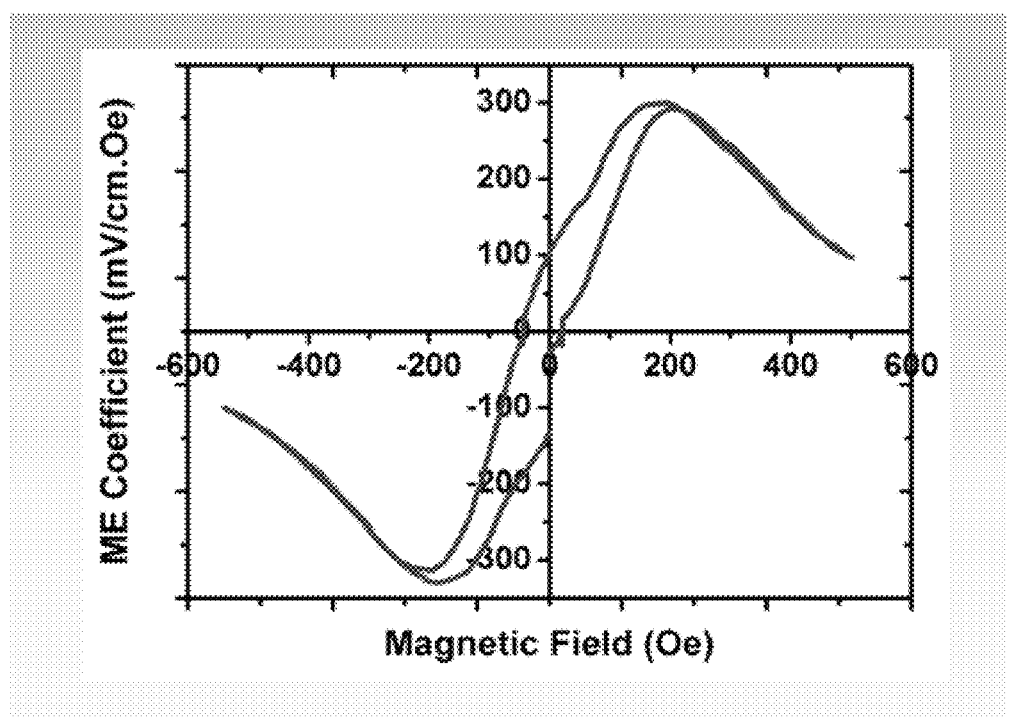
FIG. 5 is a graph showing a plot of ME coefficients versus magnetic field for PZT-Ni composite layers.

In exemplary embodiments, the means for non-linear restoring force of the device may include a nonlinear spring comprising magnetoelectric laminates such as asymmetric magnetostrictive layers or bimetal laminates or nonlinear springs such as shallow-curved arch springs. FIGS. 4A and 4B are schematic representations showing embodiments of the means for non-linear restoring force for use in a MTG device according to the invention. The means for non-linear restoring force may be a non-linear spring with a single magnetostrictive layer with a positive magnetostriction coefficient, as shown in FIG. 4A or a non-linear spring comprising a laminate of layers with different magnetostrictive coefficients as shown in FIG. 4B. The laminate may comprise 2, 3, 4, 5, 6, or more layers with one or more different magnetostrictive coefficients. The means for non-linear restoring force may also include magnetoelectric materials as shown in FIG. 5. PZT-Ni composite layers show very good ME coefficients with a modicum of self-biasing.

Magnetostriction is a ferroic order wherein materials exhibit a change in shape upon exposure to a magnetic field. Typically, the magnetostrictive effect is used to sense magnetic fields. Magnetostrictive materials may be coupled with other ferroic materials to produce a multiferroic behavior. In one embodiment, the composite laminate non-linear spring comprises two magnetostrictive layers and a piezoelectric layer. The magnetostrictive materials used for the spring substrate provide additional strain energy to the piezoelectric layer upon moving in and out of the magnetic field of the hard magnet during device oscillation.

In exemplary embodiments, the magnetostrictive material provided in the magnetostrictive layer(s) of the magnetoelectric spring comprises once or more of terbium (Te), dysprosium (Dy), TERFENOL-D (terbium-iron-dysprosium), Galfenol (gallium-iron), and/or METGLAS (iron or iron alloys), such as METGLAS 2605SC.

The magnetostrictive material will provide the desired nonlinear spring response in one of two ways. As illustrated in FIG. 4A, a material with a positive magnetostriction coefficient (e.g. Metglas, galfenol) would tend to lengthen when the material approaches the magnetic field of the hard magnet (when the MTG is in the closed state). Such a lengthening would translate to an effective stiffening of the spring in the open state, increasing the mechanical energy in the system. A similar, but potentially more energetic, configuration comprises a laminate of several magnetostrictive materials with different coefficients is shown in FIG. 4B. In the closed state, the magnetic field would cause one material to lengthen more than the other, causing a bending action in the laminate.

Figure 32:
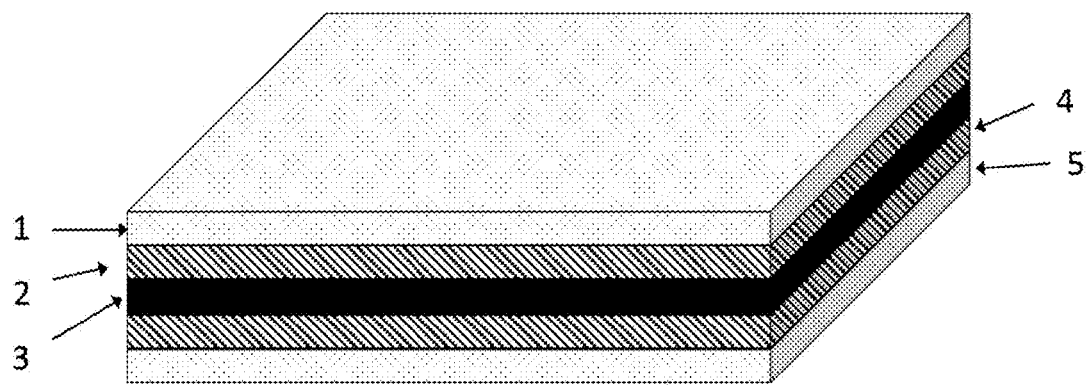
FIG. 32 is a diagram showing layers present in the spring structure (NZF, PZT, Ni).

The magnetoelectric springs of the MTG device according to the invention may be fabricated as a laminate comprising a piezoelectric material applied to one or more layers of magnetostrictive material. In an exemplary embodiment, the magnetoelectric springs comprise layers of nickel-zinc ferrite (NZF), nickel, and PZT (lead zirconate titanate (Pb$[Zr_{(x)}Ti_{(1-x)}]O_3$)). The layers of NZF, nickel, and PZT can be arranged in any configuration available to a skilled artisan. FIG. 32 for example provides an exemplary embodiment of a magnetoelectric spring structure according to the invention (see also the Examples).

As described in the Examples, the PZT and NZF bilayers can be deposited through 3D printing wherein the PZT layers are deposited on the nickel substrate while the NZF layers are deposited on top of the PZT layers. The nickel substrate may be machined to the desired structure using a laser such as an 830 nm CW fiber laser. Since nickel reacts exothermally with oxygen, argon may be used as the assist gas. The cutting pressure in this case will be less than 6 bar. For high pressure cutting, nitrogen may be used as the assist gas. A 3D printer which utilizes the aerosol deposition may be used for depositing PZT bilayers on nickel substrate and NZF bilayers on PZT bilayers. The 3D printer is capable of printing materials with viscosity 0.7-1000 cP, and the typical deposition thickness is 2-50 μm. During the deposition process, the 3D printer utilizes a stage which moves in x- and y-directions, and a deposition tip (100 μm aperture) which moves in z-direction. Two broadly applicable atomization methods—Ultrasonic and Pneumatic—may be adopted to carry out the deposition of both PZT and NZF layers. The ultrasonic atomizer is more suitable for materials with low viscosity and atomic size while the pneumatic atomizer is suitable for thicker materials.

PZT is a widely used piezoelectric ceramic material. Other piezoelectric lead ceramics such as lead zirconium titanate (PLZT), lead magnesium niobate-lead titanate (PMNT), lead magnesium niobate zirconate (PMNZ), and lead iron tungstate (PFW) can be used as the piezoelectric material in the magnetoelectric springs. Further, other piezoelectric ceramic materials, such as barium titanate ($BaTiO_3$), potassium niobate ($KNbO_3$), lithium niobate ($LiNbO_3$), lithium tantalate ($LiTaO_3$), sodium tungstate ($Na_2WO_4$), as well as piezoelectric polymers such as PVDF and PVC, can be used as the piezoelectric material.

Figure 22A:
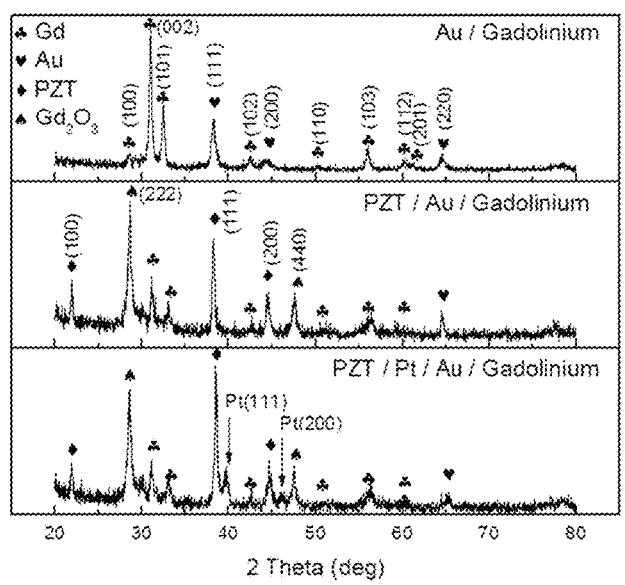
FIGS. 22A-B are respectively a graph and SEM micrographs showing XRD results and a SEM micrographs of PZT deposited on a Gd substrate.
Figure 22B:
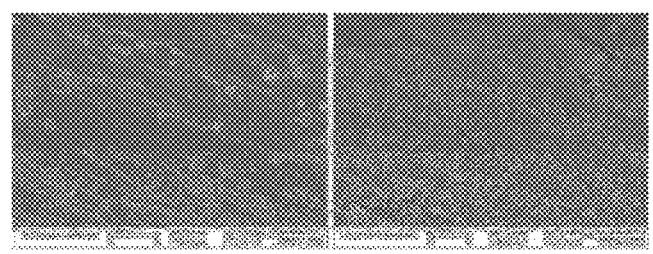
Figure 23:
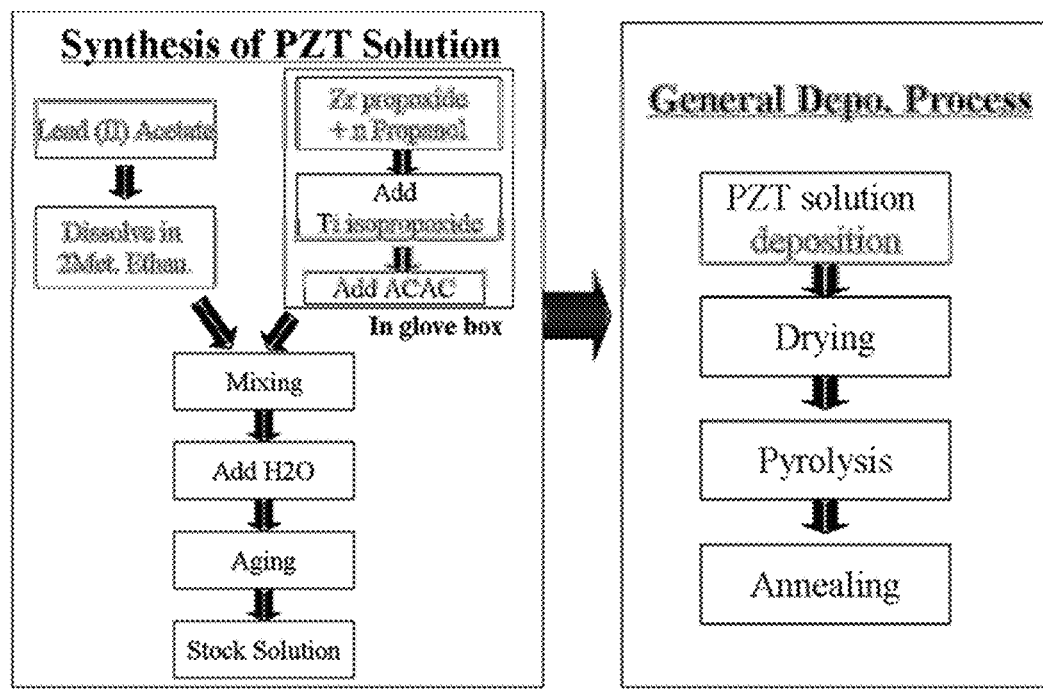
FIG. 23 is a schematic diagram illustrating an experimental procedure for the PZT solution synthesis and deposition technique.

The piezoelectric material can be applied to the magnetostrictive layers as a thin film through spin coating or 3-D aerosol jet deposition as described above. FIG. 23 shows a general process of synthesis and deposition of PZT as the piezoelectric material. FIGS. 22B, 24, and 25A and 25B show experimental deposition of PZT on metal substrates (see Examples).

Not wishing to be bound by theory, the disparate magnetostriction coefficients of the dual magnetostrictive stack provide a pre-stress to the piezoelectric material, removing the need for magnetic bias. Through proper orientation of the Ni/NZF stack and careful scaling of the relative thickness of each layer, nonlinearity to the spring deflection curve can be introduced, providing significant increase in mechanical energy. The degree of nonlinearity and total force of the springs will not only depend on relative magnetostrictive layer thickness, the geometry of the springs and difference in magnetostrictive coefficients, but also on the amplitude and variation of the magnetic field experienced during oscillation.

Figure 6:
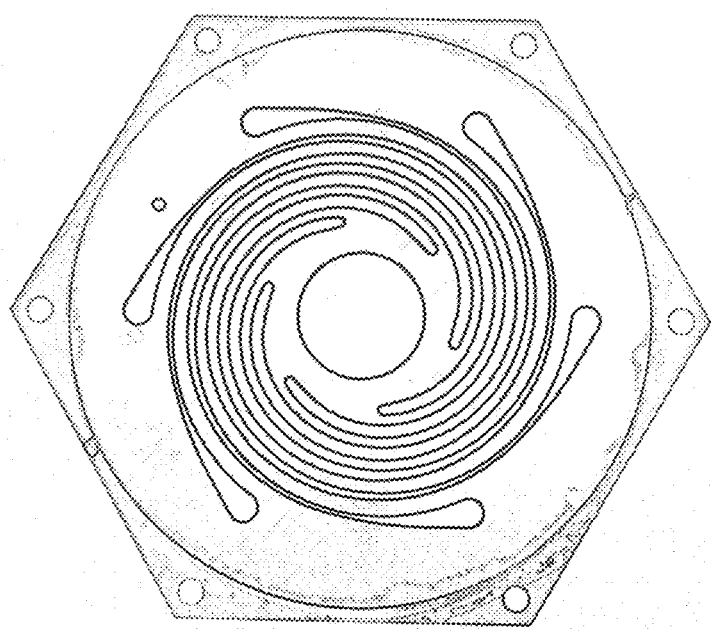
FIG. 6 is a schematic showing an embodiment of a laminate piezoelectric/ferromagnetic spring component of a MTG device according to the invention.

FIG. 6 shows an embodiment of a laminate piezoelectric/ferromagnetic spring component of a MTG device according to the invention. The laminate piezoelectric/ferromagnetic spring allows for topside coupling with added temperature-dependent material such as LSMO, gadolinium, etc. The ferromagnetic spring may be made of spring steel or nickel and allows for nonlinear coupling to backside return magnets, while providing mechanical stability to the piezoelectric material.

In exemplary embodiments, the ferromagnet layer of the MTG device may be synthesized through thin-film deposition techniques, which may comprise any magnetic material or combination of magnetic materials with both sufficient magnetization and a Curie temperature that lies within an appropriate operating range which may be expected during operation of the device. Non-limiting examples of magnetic materials that may be used in the ferromagnet layer include nickel, Gadolinium, thin-film La1-xSrxMnO3 (LSMO) ceramics, and powdered cobalt-rich metallic glasses. Magnetic materials that may be selected for the ferromagnetic layer and their Curie temperatures are provided in Table 1 later in this specification below.

In a preferred embodiment, material in the ferromagnetic layer is a member of the $La_xM_ySr_{0.2}MnO_3$ family (where M is Li or Bi, and Y ranges from 0 to 0.06 atomic percent).

In another preferred embodiment, the material in the ferromagnetic layer is a $La_{1-x}Sr_xMnO_3$ (LSMO) ceramic, wherein x=0.18-0.20.

In exemplary embodiments, the hot side hard magnet may comprise any material or combination of materials with both sufficient magnetization and resistance to demagnetization at the operating temperatures of the device. Non-limiting examples of materials that may be used in construction of the hot side magnet include neodymium-based magnets such as NdFeCo and NdFeB, as well as other commercially available magnets such as AlNiCo and SmCo.

Figure 7A:
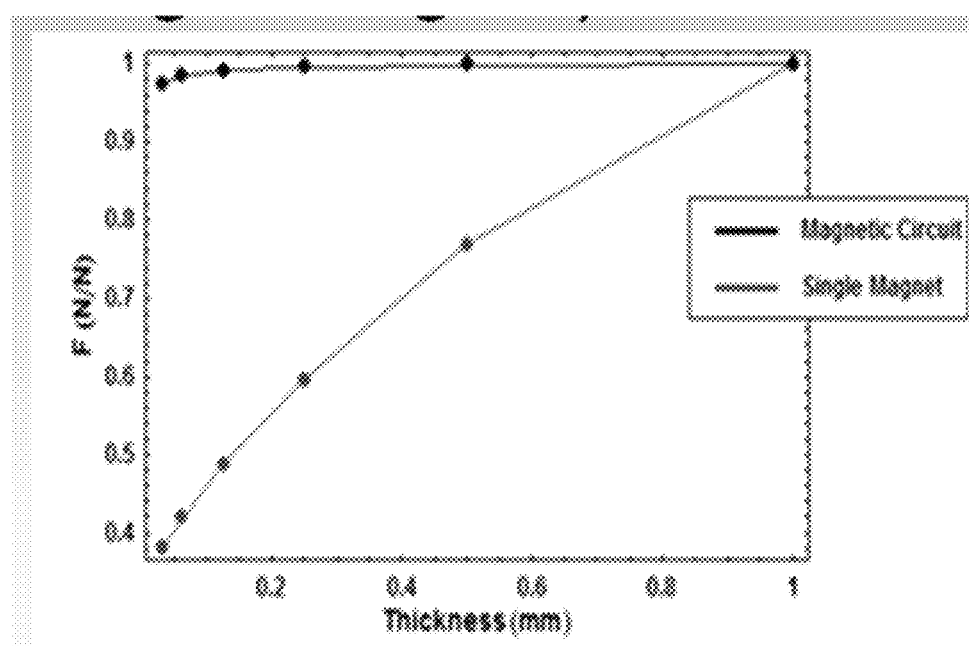
FIG. 7A is a graph of magnetic force versus thickness for a magnetic circuit and single magnet, and shows increases in magnetic energy of a magnetic circuit as opposed to a single magnet.

FIG. 7A is a plot of magnetic force versus thickness for a magnetic circuit and single magnet, and shows increases in magnetic energy of a magnetic circuit as opposed to a single magnet. Element analysis carried out in ANSYS (FIG. 7A) suggests that the reduction in magnetic force between the hard and soft magnet is much less susceptible to shape demagnetization upon decreasing the aspect ratio of the constituent magnetic elements. Through use of such system, the effective magnetic energy density of the system can be increase substantially through conversion to a magnetic circuit approach.

Figures 7B, 7C:
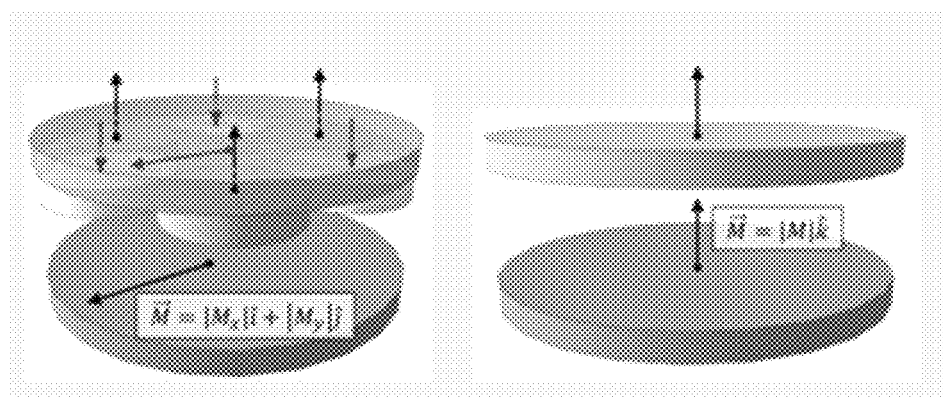
FIGS. 7B and 7C are schematic diagrams showing a magnetic circuit and a single magnet, respectively.
Figure 21:
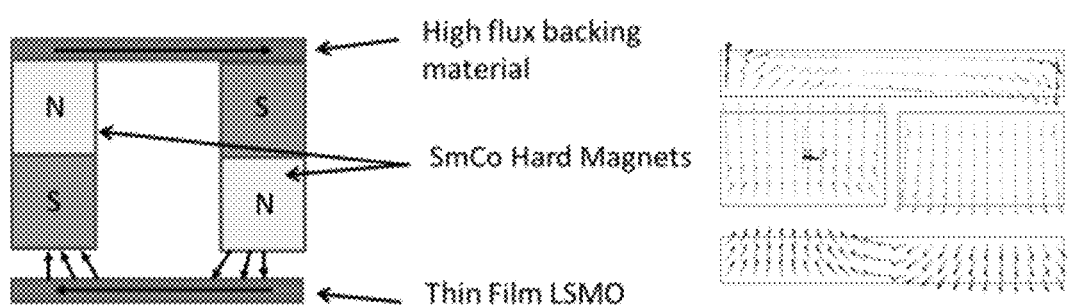
FIG. 21 is a schematic diagram illustrating reconfiguration of the drive magnet and ferromagnet into a magnetic circuit rotates the magnetic field to lie in the plane of the ferromagnet, thus reducing the shape demagnetization.

FIGS. 7B and 7C are schematic diagrams showing a magnetic circuit and a single magnet, respectively. Additionally, FIG. 21 shows magnetostatic modeling of a magnetic circuit (see Examples).

Figures 8A, 8B:
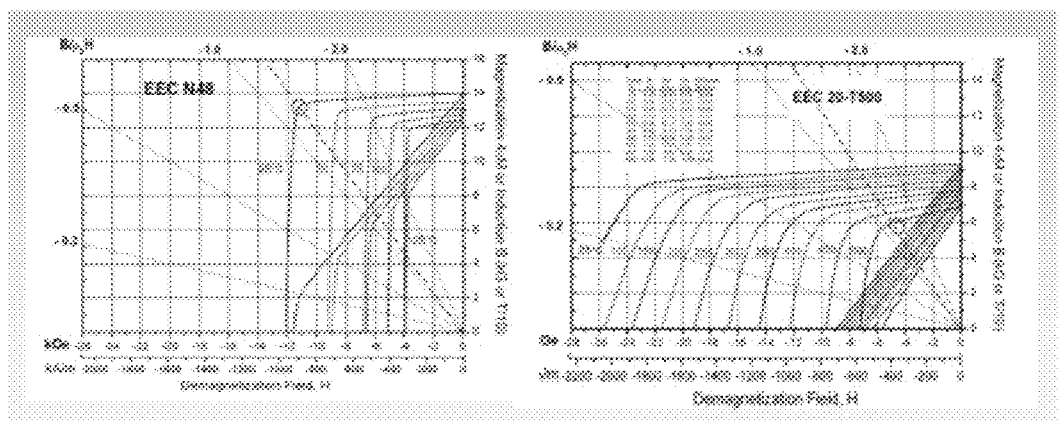
FIGS. 8A and 8B are graphs showing shape demagnetization curves for two different hot side magnetic materials for use in a MTG device according to the invention: an N48 grade NdFeCo magnet (FIG. 8A) and an SmCo magnet (FIG. 8B).

FIGS. 8A and 8B are plots showing shape demagnetization curves for two different hot side magnetic materials for use in a MTG device according to the invention: an N48 grade NdFeCo magnet (FIG. 8A) and an SmCo magnet (FIG. 8B). The hot side magnet material can be to allow for elevated temperature operation and thin magnet geometry.

Figures 9A, 9B:
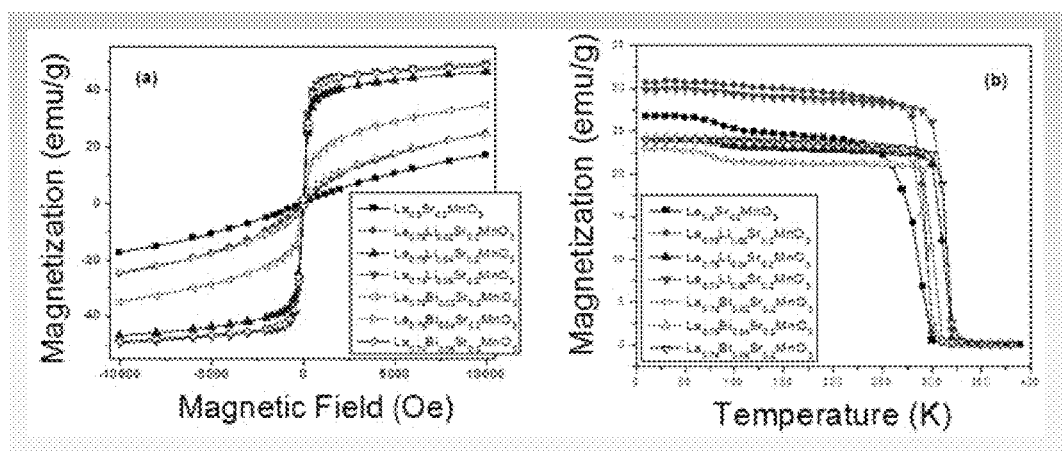
FIG. 9A is a graph showing the magnetization loops as a function of the applied magnetic field for LSMO modified with Li or Bi at room temperature.
FIG. 9B is a graph showing the temperature dependence of magnetization for Li and Bi modified LSMO ceramics.

FIGS. 9A and 9B are plots showing magnetization as a function of magnetic field and temperature for Li and Bi modified LSMO ceramics. As shown in FIG. 9B, the soft ferromagnetic material shows a Curie temperature variation with material composition. Switching temperatures of the soft ferromagnetic can thus be tuned through changes in the composition of the ferromagnet, or through changes in the device geometry.

Figure 10:
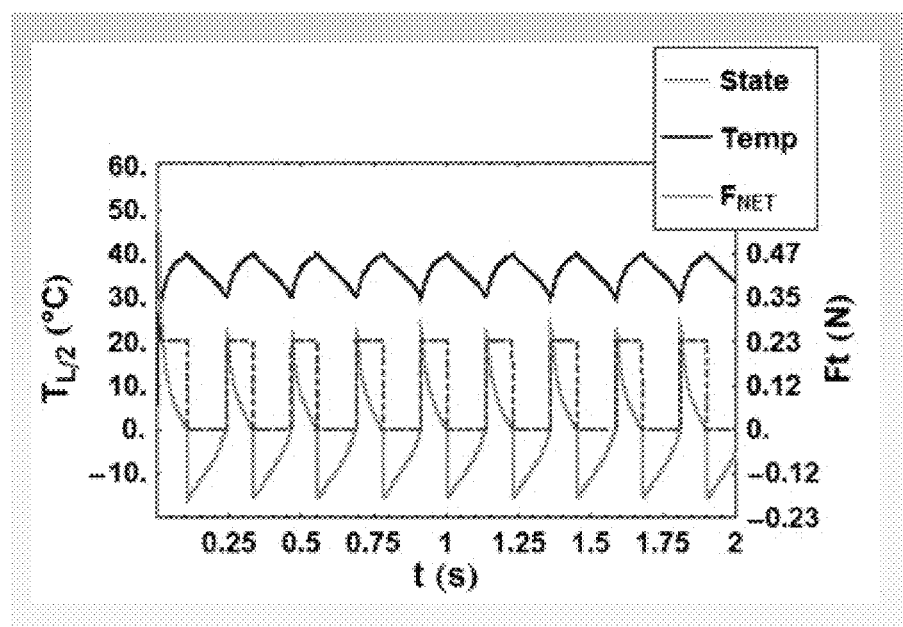
FIG. 10 is a graph showing example output of the custom-written 1D multiphysics model showing device state, mean temperature, and net force as a function of time for specified operating conditions.

FIG. 10 shows simulated performance curves for a MTG device of the invention.

Figure 11:
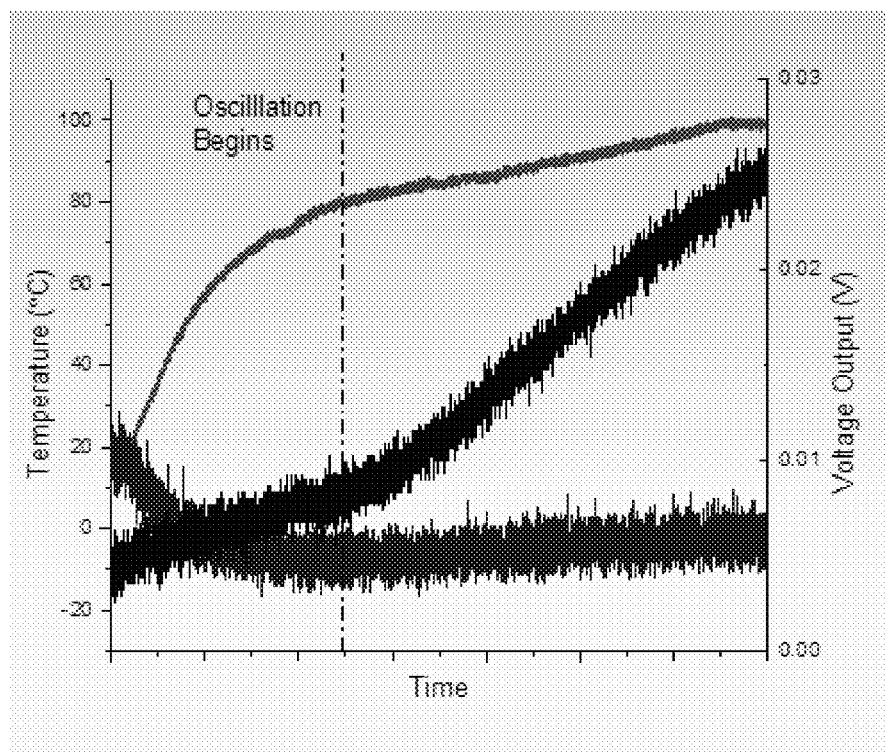
FIG. 11 is a graph showing output power (black) of a prototype of a magneto-thermoelectric device (MTG) according to the invention over time as a function of temperature gradient (red-hot, blue-cold).

FIG. 11 shows output power (black) of a prototype of a magneto-thermoelectric device (MTG) over time as a function of temperature gradient (red-hot, blue-cold).

Figures 12A, 12B:
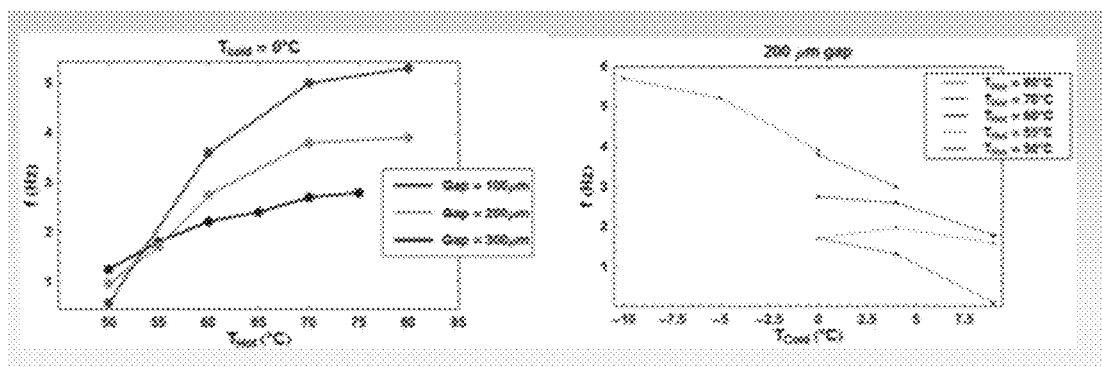
FIGS. 12A and 12B are graphs showing empirical oscillation frequencies of a prototype of MTG device according to the invention as a function of temperature, gap, and temperature gradient showing superlinear frequency to gap relationship.

FIGS. 12A and 12B show prototype performance curves, showing frequency as a function of gap and temperature gradient (FIG. 12A) or frequency as a function of temperature gradient for a 200 μm gap (FIG. 12B).

Additional features and advantages of various embodiments of the invention will be apparent in the following Examples.

EXAMPLES

Hybrid Power Harvesting System

Embodiments of the invention provide a Hybrid Power Harvesting System with improved energy conversion efficiency. This can be achieved in part by combining solar cells with MTGs as an active thermal backplane. Hybrid PV/MTG panels can be designed for example for use in solar powered air vehicles.

According to embodiments, a MTG device can be designed to maximize thermal to electrical conversion from the available thermal gradient behind PV cells, and at a weight and with scalable fabrication suitable for large arrays aboard solar air vehicles. The MTG device can be multifunctional in providing additional energy per unit weight while also substituting for traditional honeycomb support structures required for packaged PVs.

An active magneto-thermoelectric (MTG) backplane for photovoltaic cells (PV) can be used to enhance power generation capacity for solar platforms such as Boeing's Solar Eagle.

Thin PV panels for air vehicles generate heat by absorbing unconverted portions of incident solar radiation and can suffer efficiency losses of 0.5%/° C. depending on cell type and temperature. Solar aircraft require that these brittle cells be packaged for durability and these installation requirements can result in elevated PV temperatures due to isolation from convective cooling. Ambient temperatures at altitude as low as −55° C. provide the thermal sink for these cells and this thermal gradient can be harvested to produce additional power.

Design considerations of the hybrid PV/MTG include a balance between PV operating temperatures, MTG efficiency, and overall system weight. An increase in PV temperature typically lowers PV efficiency yet the MTG efficiency increases with the rising available temperature differential ($\Delta T$). Since the MTG backplane can double as support structure the weight penalty is minimal and specific power only increases. For reference the PV cell shown below (Emcore triple junction ZTJ) weighs 84 mg/cm$^2$ and the MTG backplane weighs 96 mg/cm$^2$, a typical fully packaged panel weighs 3× that of the bare cell. One such design creates an active thermal backplane for PV cells (FIG. 2).

Technological Superiority.

Light-weight—Low mass device results in excellent specific power for air-vehicle applications.

Efficient—Additional thermal harvesting while acting as a PV backplane results in higher effective efficiency for the Hybrid MTG/PV. Optimized thermal to mechanical conversion and high energy density magnetostrictive/PZT mechanical-to-electrical conversion.

Versatile—Operates over a wide range of temperatures and with very small thermal gradients.

Scalable MEMS fabrication—3D aerosol printing for scalable and volume production of PV backplanes.

Scalability process—Easily incorporated into current PV platforms of all shapes and sizes.

Efficient Thermal Capture—Efficient thermal-to-mechanical conversion through maximum magnetic force and thermal transfer. High specific power allows for a host of thermal scavenging and thermal management applications.

Tunable—Dopant controlled Curie temperature of soft-magnetic components allows the device to be configured for optimal operation over a wide range of temperatures.

Photovoltaics for Air Vehicles.

HALE platforms for ISR (intelligence, surveillance, and reconnaissance) are emerging as viable technologies. Most HALE systems will make use of solar energy to achieve time on station, RF and other payloads are increasing the need for thermal management and opportunity for thermal harvesting.

HALE platforms come in various shapes and sizes ranging from small hand-launched unmanned aerial systems (UAS's) such as the AF Solar Raven to very large high aspect ratio aircraft such as NASA's Helios to Lighter than Air (LTA) vehicles such as the Air Force ISIS, Lockheed Martin's High Altitude Airship (HAA), or the Army's Long-Endurance Multi-Intelligence Vehicle (LEMV). One thing most of these vehicles have in common is that they will utilize solar cells to achieve long times on station. PV/MTG hybrid devices according to the invention are expected to boost power generation and extend flight times for these next generation vehicles.

Power Calculations and Optimization for Solar Flight.

Solar powered high-altitude, long endurance (HALE) air-vehicles are emerging as viable platforms for many ISR, communication, and environmental monitoring missions. These specialized vehicles have unique design configurations in order to maximize photovoltaic (PV) area for power generation and, in turn, maximize endurance and payload capabilities. Design optimization studies for such solar aircraft indicates that even small increases in PV efficiency can result in large weight savings in wing structure, propulsion, and energy storage—not only allowing for potential increases in the weight of the cells to achieve that efficiency gain, but also resulting in overall improved system capability. For this reason the inventive technology for a hybrid device which not only harvests solar energy but also the waste heat generated by the PV cell is a promising approach to improve the overall efficiency of energy harvesting devices for HALE platforms and the overall capability of solar aircraft.

Figure 13:
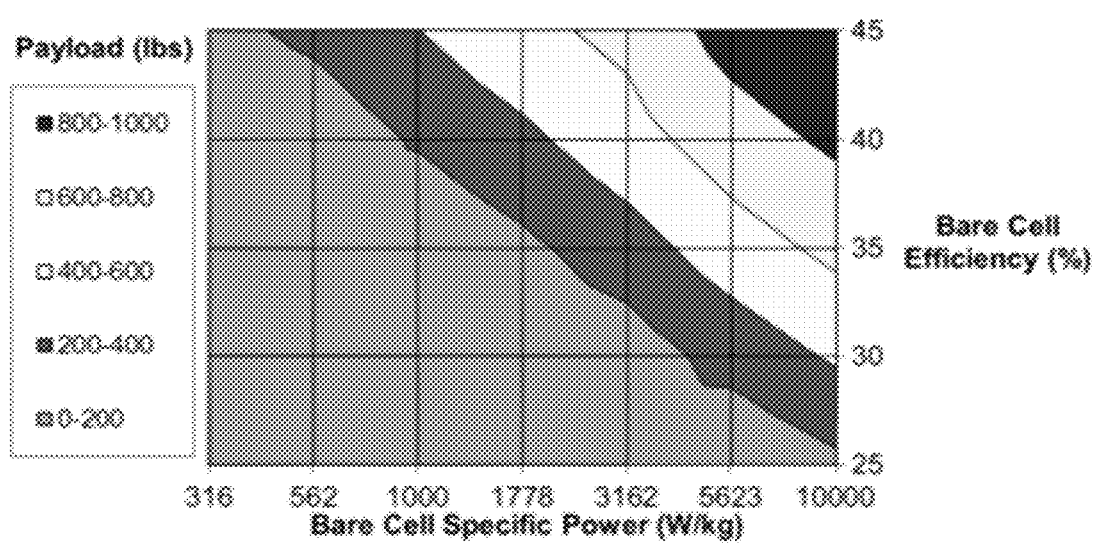
FIG. 13 is a graph showing PV cell efficiency vs. specific power with results for a PV configuration optimization for an aircraft with an operational altitude of 65 kft at 40° N.

FIG. 13 illustrates the importance of cell efficiency versus its specific power when optimizing HALE solar-electric aircraft. Given a range of solar cell performance characteristics, an aircraft was optimized to support the maximum possible payload for a mission at 65 kft at 40° N during the winter solstice (the design constraint for solar aircraft). For example, for a solar cell specific power of 10000 W/kg and an efficiency of 30%, a solar aircraft can be designed to support a 426 lb payload at 65 kft (40° N at the winter solstice). If the cell's efficiency is increased to 35% (5% point improvement) and the weight is doubled (e.g., specific power of 5000 W/kg), then an optimized aircraft can support a payload of 470 lbs—a 10% improvement. In this example, the improvement in efficiency allowed a decrease in wing area, which reduced power required, which reduced the necessary energy storage, which reduced weight, which could be converted to potential payload.

FIG. 13 is a graph showing PV cell efficiency vs. specific power. More specifically, the results are for PV configuration optimization for an aircraft with an operational altitude of about 65 kft at 40° N.

In order to evaluate technology, it is best to hold the possible payload of an optimized aircraft constant and examine the trade in cell technologies, i.e follow any of the lines above to see the technology trade for an aircraft with the stated operational assumptions. For example, if the baseline cells are 29% efficient at a specific power of 10000 W/kg, the same performance aircraft, measured in payload carried, could be designed if the cell grew in weight by a factor of 10 as long as the efficiency was increased to 45%. This might be an extreme example, but it is clear that for every percentage point of efficiency a technology can add, a decrease in 562 W/kg is allowable (or 1.78 g/W). This calculation was performed for an aircraft at 40° N at the winter solstice—a worst case scenario. As the technology converts excess heat to improved effective efficiency, the output of the inventive approach will increase as the aircraft observes more incident sunlight, and therefore generates more heat. In fact, beyond solar aircraft, the technology has great potential in solar concentrator systems or even combination solar thermal/solar electric systems.

Simulations from a custom-written multiphysics model can be used to predict the potential for significant increase in efficiency versus stand-alone photovoltaics. For example, the MTG device power curve presented in FIG. 14 was developed from actual PV data for typical silicon single crystal cells. The analysis assumes the thermal conditions obtained from an ANYSS FEA of PV's aboard a HALE aircraft.

By designing the PV encapsulants and the thermal flux through the MTG the thermal gradient can be tailored from 10° C. to 50° C. to suit a particular PV cell efficiency curve and mitigate losses due to PV heating. Assuming a 50% mechanical to electrical conversion efficiency, optimized ferromagnet thermal conductance conditions, and a properly designed restoring spring, the MTG device can generate at least 12 W/m$^2$ and potentially as much as 120 W/m$^2$ in a 45° C. thermal gradient. This increases the efficiency of a typical silicon PV by approximately 1% to 12% and as described above even a few percent increase results in a dramatic increase in solar aircraft payload.

For low efficiency thin cell types such as envisioned for ISIS, which do not suffer significant temperature induced efficiency loss, the MTG and PV panel encapsulant can be designed to provide maximum thermal insulation from convective flows. This will generate the maximum thermal gradient and therefore a larger percent increase in hybrid panel efficiency. Although the PV/MTG can improve efficiency for all cell types, it provides the most benefit for applications where 1) cell efficiency does not decrease with temperature, 2) the cells require structural support so weight penalty is minimized through multifunctional approach, and 3) the cells can be packaged and installed to achieve a desired temperature by tailoring convection on PV the surface.

Embodiments of the invention provide for power density improvements for thermal energy harvesting systems in a cost effective design. The versatility of the MTG Hybrid Harvester embodiments is such that the devices can be coupled as a photovoltaic hybrid or applied to a broad range of thermal energy harvesting applications. Such devices can exhibit increased efficiency of integrated photovoltaic magneto-thermoelectric hybrid (PV-MGT) via subsystem optimization of 1) electromechanical conversion efficiency, 2) thermo-mechanical efficiency, and 3) hard and soft magnetic material properties. Aspects of particular embodiments of the invention can include:

(1) Enhanced photovoltaic magneto-thermoelectric hybrid power generation. In particular, embodiments of the invention can provide for improved power densities for a thermal harvester utilizing magneto thermoelectric conversion.

(2) Enhanced electromechanical conversion. Galfenol/PZT laminate for example can be used to enhance the mechanical conversion efficiency of the MTG by harvesting not only from mechanically induced strain, but also the alternating magnetic field gradient inherent to MTG device operation.

(3) Improved soft-magnetic material properties and magnetic couple design. Soft magnetic materials with appropriate Curie temperatures and high saturation magnetization can greatly improve MTG efficiency.

Photovoltaic Thermal Model.

Figure 15A:
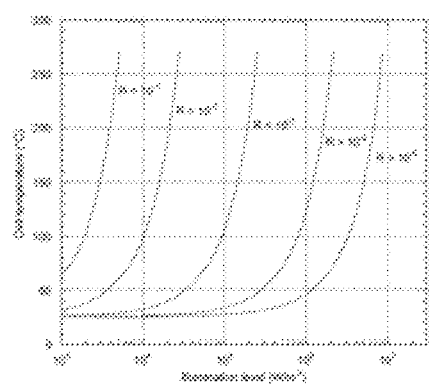
FIGS. 15A and 15B are graphs showing typical cell temperatures for various concentration levels and cell efficiency as a function of temperature for terrestrial concentrator based applications.

One of the two possible functions of the Hybrid Harvester system is to aid in cooling of photovoltaic (PV) cells. Typically, terrestrial solar cells are operated in a concentrated solar illumination mode configured in one of three ways; single cells, linear concentrators, or densely packed modules. Concentration of the solar radiation acts to reduce the area of active photovoltaic material used in solar energy production, thereby reducing the cost per Watt of energy. The literature is rich with work reporting cell junction temperature as a function of illumination concentration with a given thermal conductivity to the heat sink, as well as the corresponding cell efficiency as a function of junction temperature (FIGS. 15A and B). Photovoltaic efficiency decreases with increasing temperature, and prolonged exposure of junctions to elevated temperature can result in permanent damage. For solar concentration of less than 40 suns, passive cooling is more energy efficient than active cooling. For densely packed geometries with solar concentration levels above 40 suns, backside thermal resistances of less than $10^{-4}$ Km$^2$/W are necessary.

Figure 15B:
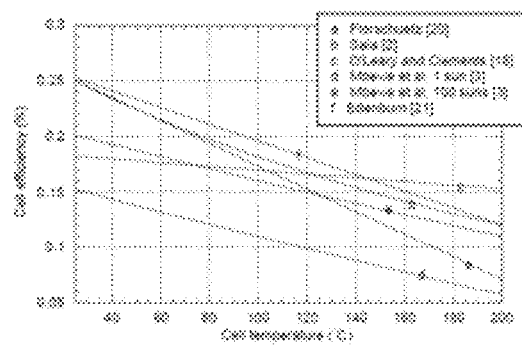

FIGS. 15A and 15B are graphs providing typical cell temperatures for various concentration levels and cell efficiency as a function of temperature for terrestrial concentrator based applications. See Royne, A. "Cooling of photovoltaic cells under concentrated illumination: a critical review", Solar Energy Materials and Solar Cells 86 (2005), 451-483, doi: 10.1016/j.solmat.2004.09.003.

Since one use of embodiments of the invention is to provide photovoltaics integrated into solar aircraft, thermal modeling of the PVs under the constraints of high-altitude flight can be a useful tool in evaluating various devices. For example, model constraints can be formulated to reflect thermal conditions of solar flight, i.e. reduced top and bottom side convection coefficients, and significantly reduced ambient temperatures.

The ANSYS thermal steady state analysis was performed on the PV/MTG hybrid device in order to determine the thermal gradient available in a typical flight application. The FEA analysis was iterated in conjunction with the MTG multi-physics model in order to determine the available thermal gradient and the resulting thermal flux transported by the MTG oscillator. First, an estimate was made at the MTG flux and this was input to the FEA. Next, the FEA was used to calculate the available thermal gradient and these temperatures were fed back to the multi-physics model to calculate a new flux. This process was iterated until convergence of the flux and temperature values was achieved. The result was that the MTG oscillator transports 4000 W/m$^2$ and this was applied to the magnet surfaces of the FEA to represent the average flux moved by the oscillator. An incident solar flux of 600 W/m$^2$ and a convection of 2 W/m° C. was applied to the PV cell surface. Additionally, a convection of 3 W/m° C. was applied to the aluminum backside heat sink and symmetry boundary conditions were applied to all edges of the unit cell. Ambient temperatures were set to −55° C. which is representative of the temperature at 65,000 ft. The model analysis parameters are shown in FIGS. 16A-B and results for temperatures and flux are shown in FIGS. 17A-C.

Figures 16A, 16B:
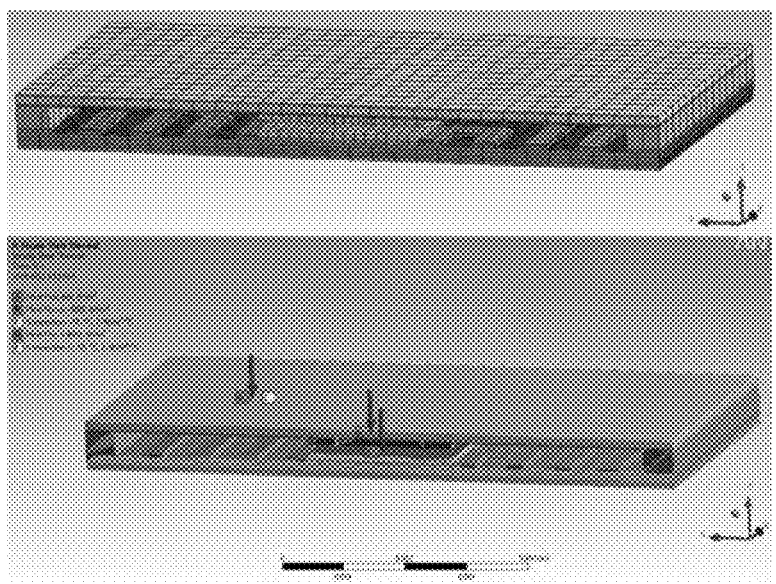
FIGS. 16A-B are diagrams showing results of ANSYS thermal FEA performed to predict thermal gradients due to PV heating with Finite Element mesh (FIG. 16A) and thermal loads and boundary conditions (FIG. 16B).
Figures 17A, 17B, 17C:
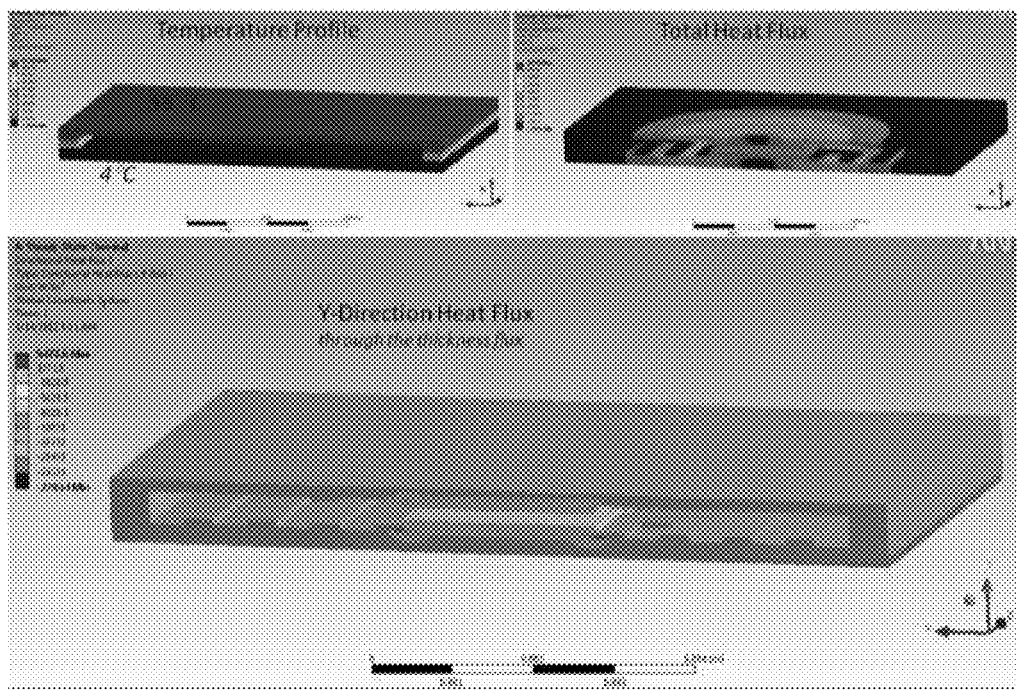
FIGS. 17A-C are diagrams showing FEA results from thermal analysis of the PV/MTG Hybrid Harvester with the temperature profile (FIG. 17A—top left), total heat flux (FIG. 17B—top right), and through the thickness heat flux (FIG. 17C—bottom).

More particularly, as shown in FIGS. 16A-B, ANSYS thermal FEA was performed to predict thermal gradients due to PV heating. Finite Element mesh (FIG. 16A—top) and thermal loads and boundary conditions (FIG. 16B—bottom). FIGS. 17A-C show FEA results from thermal analysis of the PV/MTG Hybrid Harvester. Temperature profile (FIG. 17A—top left), total heat flux (FIG. 17B—top right), and through the thickness heat flux (FIG. 17C—bottom).

The PV modeling suggests that the temperature gradients available between the backside of the photovoltaic and the cold sink can range from as low as $\Delta T \approx 0°$ C. up to as much as $\Delta T \approx 50°$ C. The photovoltaic temperatures are highly dependent on encapsulant insulating properties and the ambient conditions associated with the flight regime. Furthermore, the reduction in thermal flux through the MTG (as opposed to a direct thermal bond with a heat sink) acts to further increase the thermal gradient.

Device designs can also be configured to address performance issues more relevant for solar flight than for terrestrial solar farm applications. Specifically, the focus can be on metrics such as mass, net efficiency, and Hybrid PV/MTG specific power levels. Initial studies were made into the applicability of the MTG as a supplement to solar aircraft. Aircraft optimization studies suggest that with proper tuning, a PV/MTG hybrid system could provide for a net increase in system efficiency without incurring a prohibitive mass penalty.

Fabrication of Macro-Scale Prototype.

A macro-scale prototype was fabricated to better understand the operation of the hybrid harvester device. The prototype was constructed on an aluminum base, and used commercial NdFeCo magnets and a gadolinium soft magnet. The hard magnets are arranged to produce a magnetic circuit wherein the magnetic force is a linear function of ferromagnet thickness. The prototype features both hot- and cold-side thermoelectric units for temperature control during evaluation, as well as a vacuum chamber to explore the effects of atmosphere on device operation. The springs are made from a sheet of machined phosphor bronze and feature a rectangular for the gadolinium ferromagnet. The preload tension of the spring can be adjusted through insertion or removal of spacer shims. The hard-to-soft magnet gap spacing can also be adjusted through symmetric placement of shim material.

The macro-scale functional prototype is capable of operation over a wide range of temperatures, thermal gradients and gap spacings. For example, this prototype functioned at frequencies approaching 10 Hz at ambient pressure. More particularly, the prototype shows stable and reliable operation over a wide range of operational parameters. The device oscillates with hot side temperatures ranging from 50° C. to 90° C., and cold side temperatures ranging from −10° C. to 20° C., with minimum temperature gradients as low as 30° C. The harvester operates with gaps from 300 μm down to ~50 μm. Under optimized operational parameters, the prototype shows ambient pressure oscillations that approach 10 Hz which is on par with published results.

In general, increases in temperature or gradient result in increases in oscillation frequency (FIGS. 12A and 12B). The temperature-frequency relationship is governed predominantly by the increased thermal flux into and out of the gadolinium piece, resulting in faster heating and cooling of the ferromagnet. Reduction in the gap spacing results in a nonlinear increase in operational frequency (FIGS. 12A and 12B), mainly due to the nonlinear shape of the magnetic field of the hard magnet. Similarly, although a reduction in the thickness of the ferromagnet reduces the net magnetic force in the system, such a reduction also decreases the thermal inertia of the soft magnet, acting to increase operational frequency. One of the more important concepts that were made evident through experimentation with the prototype is that miniaturization of the harvester through a reduction in gap and thinning of the ferromagnet, is absolutely essential to increase the power density of the MTG device.

Modeling.

In addition to the finite element modeling presented above a multiphysics model was assemble to capture the magnetic, thermal, and dynamic behavior of the MTG oscillator. The multiphysics and thermal models operate such that there is a required degree of iteration of parameters between the two. Specifically, the value of the heat flux through the thickness of the MTG device affects the hot and cold side temperatures of the photovoltaic cell in the thermal model. Conversely, the bounding conditions imposed by the thermal gradient of the system are used in the multiphysics model to determine the operational frequency and average heat flux through the MTG device. For accurately modeling, these two systems must be solved iteratively, providing a feedback mechanism between the two.

Coupled Multiphysics Operation Model.

Experimentation with the macro-scale prototype demonstrated the vast parameter space of the hybrid harvester device. Even without considerations of parallelism, condensation, and thermal expansion coefficients of constituent sub-subcomponents, there are a myriad of variables that influence the operational frequency and mechanical energy of the system. Furthermore, these variables are not often independent system parameters, but are often interdependent variables with obscured interrelationships.

Figure 18:
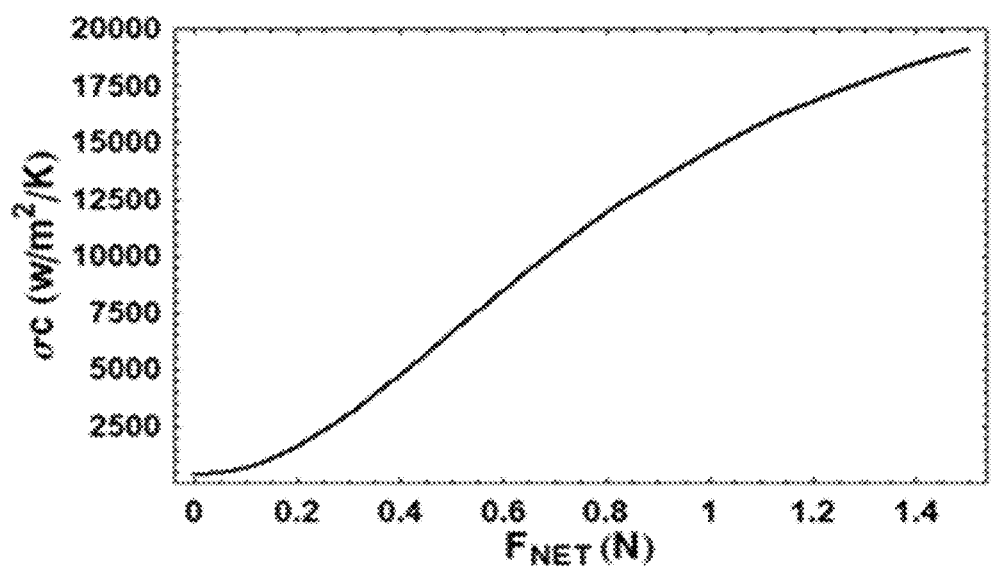
FIG. 18 is a graph showing the relationship between applied magnetic force and contact resistance.
Figure 19:
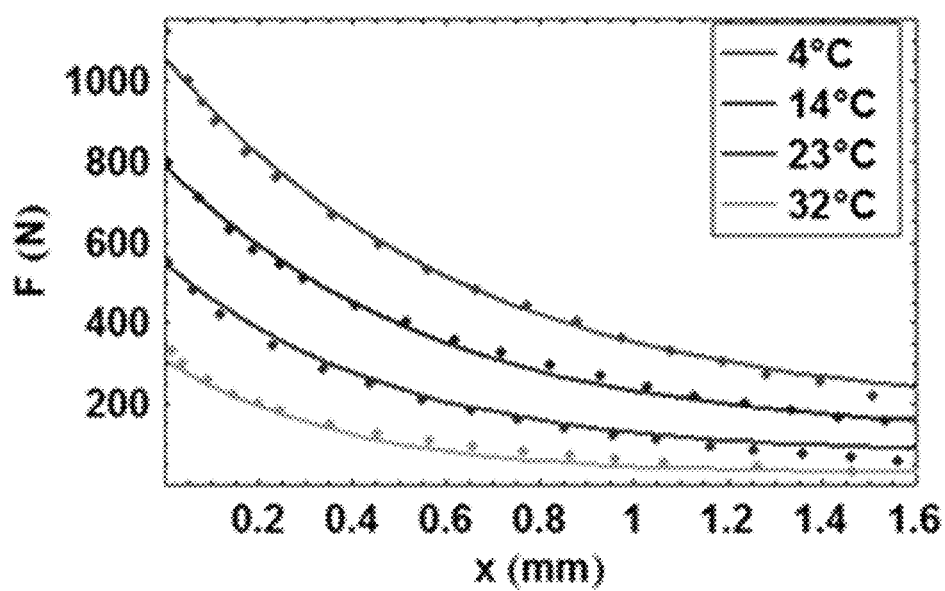
FIG. 19 is a graph showing empirical magnetic force as a function of temperature and distance used in the multiphysics model of FIG. 10.

In order to better understand the relationship between the multitude of system parameters and the performance of the MTG device, a custom-written multiphysics operational model was generated. The model allows for easy parameterization of the hot and cold side temperatures, spring mechanical properties (preload and spring constant), gap geometry, and ferromagnet thickness. The contact conductance on both the hot and cold side are functions of the net force (i.e. FM[x,T]-FSpr[x]) acting on contacted surfaces, providing for a non-linear thermal flux relationship (FIG. 18).

The coupled model generates data on a wide number of performance markers. As shown in the output plot of FIG. 10, the state, temperature, and net force acting on the ferromagnet are chief figures of merit for device operation. Additionally, average heat flux through the device, total mechanical energy in the system, and duty cycle offer further insights into the operation of the device and act to guide design of future devices.

The model shows good agreement with empirical data of the macro-scale prototype operation. The model predicts linear increases in operational frequency with increases in thermal gradient, and with decreases in spring preload values. Scaling either the gap or the thickness of the ferromagnet results in nonlinear changes in frequency, and justifies the drive to miniaturization. The model also illuminated the need for a spring with a non-linear stiffness characteristic to increase mechanical energy stored in the system.

Magnetic Force as a Function of Position and Temperature.

Figure 20A:
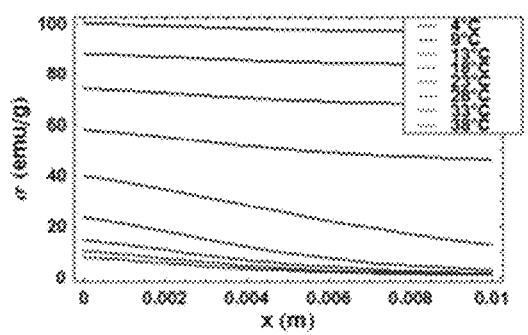
FIG. 20A is a graph showing magnetization of bulk gadolinium as a function of temperature and H-field.
Figure 20B:
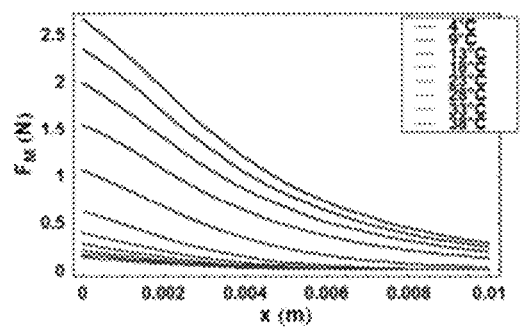
FIG. 20B is a graph showing magnetic force between a gadolinium ferromagnet and an NdFeCo magnetic for various Gd temperatures.

The balance between the forces acting upon the ferromagnet during oscillation is of key importance in the design of the harvester according to some embodiments. When the soft-magnet block is in contact with the cold side of the harvester, the magnetic force due to the interaction of the magnet field and the ferromagnetic must exceed the counteracting spring force. Conversely, the spring force of the system must be adequate to pull the hot ferromagnet from the hot-side of the harvester. Design of the spring parameters typically involves calculation of the magnetic force between the hard and soft magnet. Magnetic models can be established to calculate the magnetic field between the hard magnet and a thin piece of gadolinium, using magnetization data reported in the literature (FIGS. 20A and 20B). See for example Ponomarev, B. K., "Magnetic properties of gadolinium in the region of the paraprocess," J. Magnetism and Magnetic Materials 61 (1986) 129-138; Elliott, J. F., "Some magnetic properties of gadolinium metal," Physical Review, 91 (1) 1953; and Nigh, H. E., "Magnetization and electrical resistivity of gadolinium single crystals," Physical Review 132 (3) 1963.

In embodiments, these magnetic force calculations are only the first step in calculation of the governing forces in the Hybrid Harvester in that they do not account for shape demagnetization of either the hard or soft magnets. Reconfiguration of the magnetic field to lie in the plane of the ferromagnet may involve a reformulation of the expression of the resulting magnetic force. Such calculations lend themselves to commercial FEA software suites such as ANSYS or Maxwell3D, although a closed-form solution would facilitate incorporation into our current 1-D multiphysics FDM model.

FIGS. 20A and 20B show magnetization of bulk gadolinium as a function of temperature and H-field (FIG. 20A) and magnetic force between a gadolinium ferromagnet and an NdFeCo magnetic for various Gd temperatures (FIG. 20B).

Nonlinear Springs.

Figure 14:
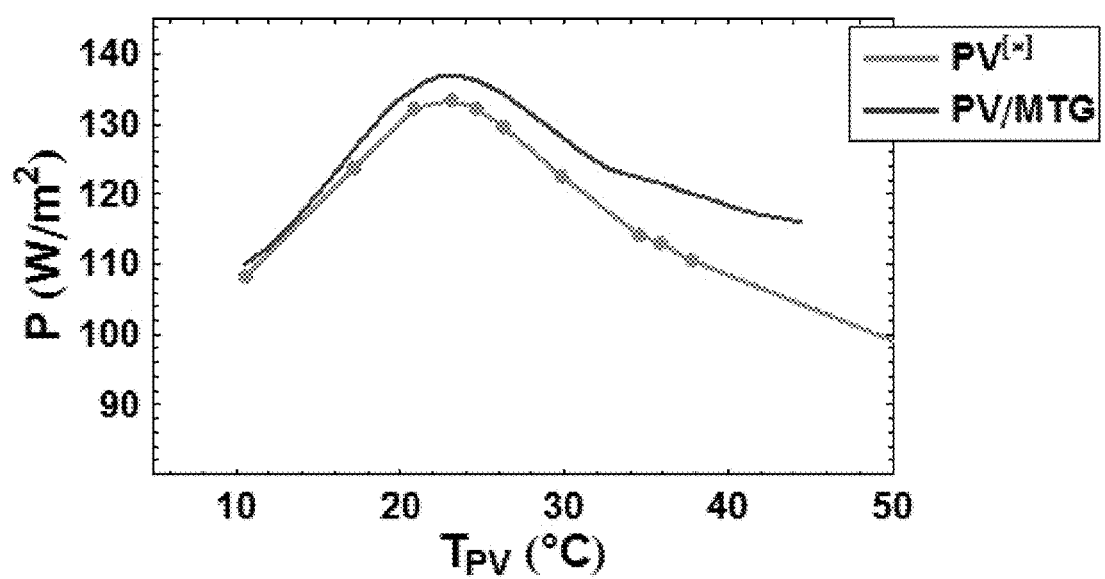
FIG. 14 is a graph showing a MTG power curve developed from actual PV data for typical silicon single crystal cells.

The mechanical energy stored within the system is a function of the magnetic force displacement product for the hot and cold ferromagnet critical temperatures. As shown in FIG. 14, for a simple linear spring system, the temperature of the ferromagnet oscillates between values defined by the spring preload, spring constant, and the hard-to-soft magnet gap. For a nonlinear spring system however, the operational temperatures are defined solely by the properties of the spring. As such, the temperature swings of the ferromagnet can be made to operate across a wider gradient through use of non-linear spring properties. Increasing the thermal gradient of the system will directly increase the mechanical energy in the system.

Furthermore, the output power is the product of the mechanical energy, the operational frequency, and the mechanical to electrical conversion efficiency of the harvesting springs. The operational frequency of the system is strongly influenced by the thermal contact resistance between the ferromagnet and the hot- and cold-sides of the harvester. Since the net forces acting on the ferromagnet in either the open or closed state (see extrema in the shaded green regions of FIGS. 3A and 3B) are much larger for the non-linear spring configuration, incorporation of non-linear spring dynamics will also act to favorably influence the contact resistance of the system. Depending on the configuration of the system (geometry of the ferromagnet and shape of the contact resistance curve), decreases in frequency due to a larger thermal load for non-linear systems can be overcome through a significantly enhanced thermal flux through the ferromagnet. Proper tuning of the non-linear system could also act to increase the operational frequency of the system. Preliminary results of our model suggest up to an order of magnitude increase in system power with the inclusion of properly tuned non-linear springs.

Magnetostatic Modeling.

FIG. 21 illustrates that reconfiguration of the drive magnet and ferromagnet into a magnetic circuit rotates the magnetic field to lie in the plane of the ferromagnet, thus reducing the shape demagnetization. Such orientations are difficult to handle with closed form solutions, and as such were handled using commercial FEA software.

It has been found that miniaturization is essential to increase power density. The increase in power with miniaturization comes through a decrease in thermal inertia of the ferromagnet. Miniaturization also presupposes an increase in observed magnetic force due to reduced proximity between magnetic components through a reduction in the gap between hot- and cold-sides. However, simple thinning of magnetic structures incurs a field penalty due to shape-induced demagnetization.

In order to prevent near-complete demagnetization of the thin films when the field of the hard magnet is oriented perpendicular to the manganite film, the hard magnet can be designed to produce a field that is parallel to the plane of the manganite film (FIG. 21). Finite Element analysis carried out in ANSYS (FIG. 7A) suggests that the reduction in magnetic force between the hard and soft magnet is much less susceptible to shape demagnetization upon decreasing the aspect ratio of the constituent magnetic elements. Through use of such system, the effective magnetic energy density of the system can be increase substantially through conversion to a magnetic circuit approach.

MEMS-Scale Fabrication and Packaging for Low-Cost Photovoltaic Integration.

Magnetostriction can be defined as the process of inducing a change in the shape of ferromagnetic materials with an applied magnetic field. Magnetostrictive properties can be exploited for use in the areas of actuating, sensing, and energy harvesting. With regards to energy harvesting for the MTG device, ferromagnetic transducers can convert the oscillating magnetic field into additional strain on the PZT layers of the laminate. In this way both the mechanical energy from vibrations and the oscillating magnetic field are harvested. Since there is bias field always available due to the hard magnet this technique becomes promising in the MTG. All ferromagnetic elements show magnetostrictive properties, but they can be enhanced by the use of lanthanides such as terbium (Te) and dysprosium (Dy). This is because of their magnetic anisotropy at higher temperatures. It is well-known that stand alone iron (Fe), nickel (Ni), and cobalt (Co) exhibit magnetostriction on the order of 10-30 ppm, however, compounds using the rare-earths exhibit magnetostrictions on the order of $10^2$-$10^3$ ppm. The most common and widely-used of these compounds are Terfenol-D (terbium-iron-dysprosium) and Galfenol (gallium-iron). These materials have strong ferromagnetic properties and high Curie temperatures, of around 500-700 K. Terfenol-D has been used in the industry for much longer, providing a higher magnetostriction with respect to Galfenol, as well as all other basic ferromagnetic materials. However, with yield strengths around 30 MPa, Terfenol-D is brittle compared to Galfenol's ductility, as Galfenol was reported to have yield strengths greater than 500 MPa. Further, Galfenol can sustain higher processing temperature. This makes it promising for designing piezoelectric—magnetostrictive laminate composite but one drawback may be that Galfenol oxidizes easily during high temperature synthesis in air. Using Pt as a barrier layer on Galfenol, one can sol-gel spin coat PZT film. The pyrolysis conditions were:

30 min at about 300° C. and the annealing was done at about 600° C. for about 10 min. FIGS. 22A-B show the Xray Diffraction (XRD) patterns of the deposited film and surface microstructure. The film exhibited rough surface with some porosity. Thus, in addition to an oxidation problem, the mismatch in thermal shrinkage produces high stresses that are released by creating roughness and pores. In parallel to deposition on the Galfenol surface, experiments were also conducted with Gadolinium (Gd). It should be noted that Gd is highly reactive with water and common sol-gel solvents which makes further processing quite difficult. The reason film was deposited on a Gd surface was to test the possibility that if PZT is on the top of the Gd then it will undergo pulse stressing as Gd makes contact with the hard magnet (Nd—B or Sm) surface. This changes the thermal contact conditions but could be used to tailor the Curie temperature of soft magnet. Using Au and Pt as a protective layer for Gd, PZT films were deposited using pulsed laser deposition at room temperature under the conditions of 10 Hz, 10E-4 Torr, 20000 shots, post annealing for 90 min at 650° C., 10 Torr. FIGS. 22A-B show the results illustrating that it is possible to grow good quality PZT on the Gd surface.

However, in conducting these experiments it came to be realized that it will be complex to scale the process for PZT deposition on the Galfenol or Gd surface to large scale production as they both require buffer layers to prevent oxidation and reduce mismatch in the thermal expansion coefficient. This adds additional deposition steps and requires techniques such as pulsed laser deposition. Further, magnetostriction in Galfenol is highly anisotropic and thus using this material as substrate poses challenge. In addition, Galfenol is at least one order magnitude more expensive that nickel. In light of these facts, it was decided to use nickel as the magnetostrictive substrate and also as the metal layer in piezoelectric bimorph structure. In order to reduce the fabricating cost and scale-up the process for large scale fabrication, the focus was on developing the 3D printing process for the PZT solution on nickel substrate.

PZT [Pb($Zr_{0.6}Ti_{0.4}$)$O_3$] solution was synthesized using alkoxide-based raw materials. FIG. 23 shows the schematic diagram for the synthesis of PZT solution and general deposition process flow. This PZT solution can be used for spinning-based deposition or as ink in the aerosol jet process. One goal was to directly deposit PZT on metallic magnetostrictive materials using 3-D aerosol jet deposition. For understanding the synthesis stages, a conventional spin-coating technique was also employed.

Figure 24:
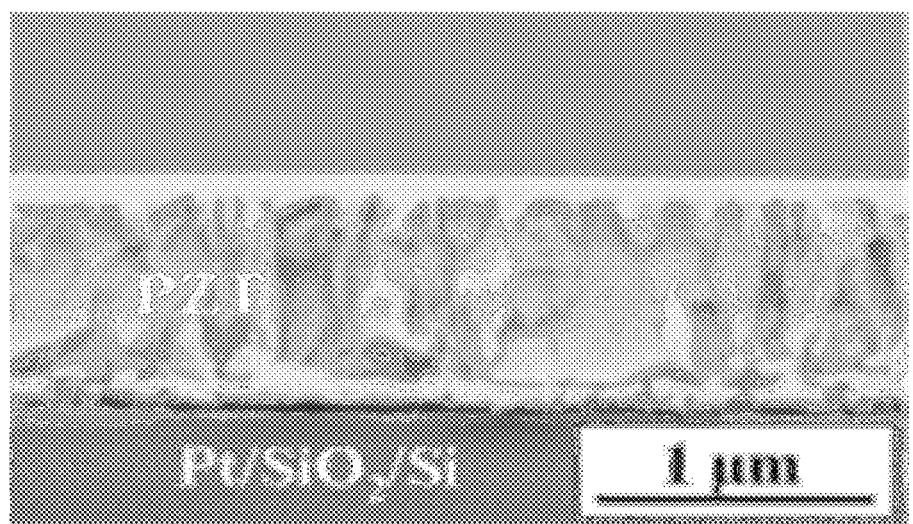
FIG. 24 is an SEM image of the PZT thick film on Pt/Ti/SiO$_2$/Si.

FIG. 23 provides a schematic diagram illustrating the experimental procedure for the PZT solution synthesis and deposition technique. The PZT films were deposited on Pt/Ni and Pt/Ti/SiO2/Si substrates using the spin coating method. As shown in FIG. 24, 1 μm-thick PZT film was successfully synthesized on a platinized silicon substrate without any cracks or delamination. FIG. 24 provides an SEM image of the PZT thick film on Pt/Ti/$SiO_2$/Si.

Figure 25A:
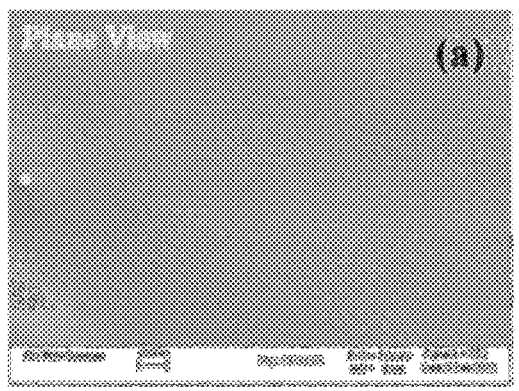
FIGS. 25A and 25B are SEM images of PZT thick film on Pt/Ni.
Figure 25B:
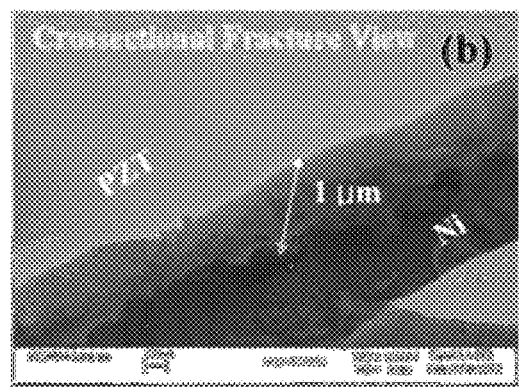

Next, PZT films were deposited on a platinized nickel substrate (Pt/Ni). FIGS. 25A and 25B show their plane and cross-sectional views, displaying no cracks or delamination. It should be noted that there were localized micro-cracks in the films which could be removed by optimizing the annealing conditions and solution composition. Additional methods such as the use of diffusion barriers to increase the film quality can also be used.

The PZT film was deposited using aerosol jet printing by controlling molar concentration, viscosity, atomization, carrier gas density, and printing speed. The aerosol jet printing equipment can be used to deposit PZT films on Ni and Si substrates. This printing technique enables deposit of the final structure without any etching or additional machining. Various printing techniques can be used, including 3D printing techniques: aerosol jet deposition, printed PZT zigzag structure on Pt/Ni substrate, and printed PZT pattern on a platinized Si substrate.

Selection and Synthesis of Cold-Side Soft Magnetic Material.

Soft magnetic materials with a wide range of curie temperatures are commercially available, from common, elemental materials (such as nickel or gadolinium) to exotic compound materials (such as $La_{1-x}Ca_xMnO_3$ or Gd-based compounds), as presented in Table 1.

TABLE 1

Curie Temperature of Select Magnetic Materials

| Materials | Curie Temperature (° C.) |
| --- | --- |
| Fe—Ni | 500 |
| Non-Oriented Si—Fe | 490 |
| MnZnFeO | 150 < T < 300 |
| Gd5(SiXGe1-X)4 | −26 < T < 7 |
| Gd5(Si1.985Ge1.985Ga0.03)2 | 17 |
| Ni52.6Mn23.1Ga24.5 | 27 |
| MnAs | 45 |
| MnAs0.9Sb0.1 | 13 |
| MnFeP0.45As0.35 | 27 |
| $La_{1-x}Ca_xMnO_3$ | −43 < T < −6 |
| $La_xM_ySr_{0.2}MnO_3$(LSMO) | 30 < T < 50 |

See also Gedik, E., "Magnetic Refrigeration technology applications on near-room temperature," 5$^{th}$ International Advanced Technologies Symposium (IAST '09), May 13-15, 2009, Karabuk, Turkey.

Gadolinium is common, readily available, and has already been used successfully by the inventors in MTG harvesters. See Ujihara, M. "Thermal energy harvesting device using ferromagnetic materials", Appl. Phys. Lett. 91, 093508 (2007), doi: 10.1063/1.2775096. With a Curie temperature of ~20° C., Gd-based harvesters lend themselves well to laboratory experimentation, requiring only limited cold-side coolant (e.g. thermoelectric cooler (TEC) or ice water). For the macro-scale prototypes, an elemental gadolinium soft magnet was used, incorporating a sample of Gd acquired from Alfa Aesar. The material safety data sheet reports an affinity for oxygen and material handling concerns, suggesting the need for a protective surface coating. Although X-ray diffraction analysis performed suggests that oxidation of the Gd is a kinetically slow process, as-received gadolinium samples were sputtered-coated with gold. A soft metallic coating on the surface will increase thermal transport of the soft magnet mass—both by decreasing the contact resistance and by increasing the thermal conductivity.

In order to broaden the application space of the hybrid harvester when coupled to a photovoltaic, the curie temperature of the ferromagnet is preferably tuned. Furthermore, both modeling and empirical data have demonstrated that miniaturization of the system is critical for maximum energy density. The ideal ferromagnet for the system would therefore be easily synthesized in thin film format, and allow for tuning of the Curie temperature over the 30° C.-50° C. temperature range without significant retooling of the deposition process or materials. Pulsed laser deposition (PLD) of thin-film manganites can be used, particularly those of the LaXMYSr0.2MnO3 family (where M is Li or Bi, and Y ranges from 0 to 0.06 atomic percent). Films of different manganite composition grown to date show controllable Curie temperatures of up to 70° C. with good magnetic properties.

Figure 26A:
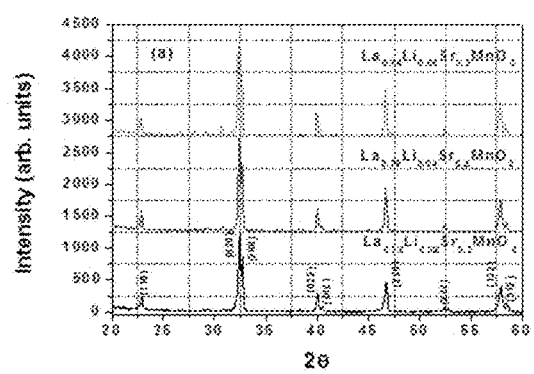
FIGS. 26A-B are graphs of XRD analysis of Li and Bi modified LSMO ceramics.
Figure 26B:
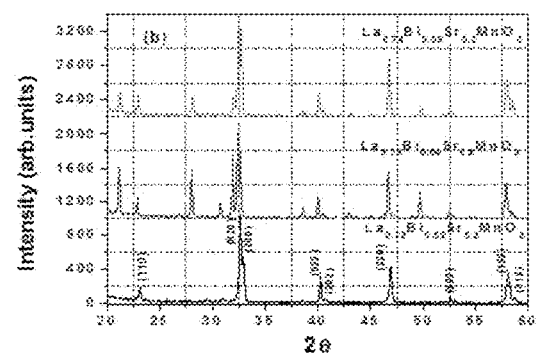

Optimization of the La/Sr ratio in the (La,Sr)MnO$_3$ system has also been conducted to identify the transition temperature. The La$_{1-x}$Sr$_x$MnO$_3$ (LSMO) ceramics with six different compositions (x=0.18, 0.19, 0.195, 0.2, 0.205 and 0.21) were synthesized by using mixed oxide solid-state reaction method. All sintered samples exhibited a very high relative density of more than 99% of theoretical value. The phase and microstructure of sintered samples were examined using X-ray diffraction (XRD, PANalytical X'Pert, CuKα; Philips, Almelo, the Netherlands), scanning electron microscopy (SEM, FEI Quanta 600 FEG; Philips). In another set of experiments, the samples were modified with Li and Bi to see the shift in the transition temperatures. FIGS. 26A and 26B show XRD analysis of Li and Bi modified LSMO ceramics. More particularly, the XRD pattern of the sintered samples with Li doping showed perovskite phase with very small amount of secondary phase (FIG. 26A), while those with the 4% and 6% Bi showed the presence of significant fraction of 2nd phase (FIG. 26B). The indexing of the peaks was done based on the orthorhombic unit cell. The second phase is associated to the presence of Bi-rich liquid phase formed during the high temperature sintering. Samples with 4 mol % Bi exhibited large fraction of second phase and as such the measurements conducted on the samples are influenced by the secondary phase.

Microstructural analysis of the polished and thermally etched sintered samples was conducted using the Zeiss Leo Smart SEM. The microstructure of the sintered samples for all the compositions showed the presence of the porosity which decreased with increasing dopant concentration. The grain size was also found to increase with increasing Li and Bi content. The magnetic properties of all the compositions were measured using a Quantum Design 'SQUID' magnetometer. FIG. 9A shows the magnetization loops as a function of the applied magnetic field for LSMO modified with Li or Bi at room temperature. The room temperature hysteresis loops with 4 mol % Li and 6 mol % Li or Bi were found to saturate with 1T applied magnetic field while samples with 2 mol % Li, 2 and 4 mol % Bi cannot be saturated at the same applied magnetic field. Generally, the magnitude of magnetization increased with the doping concentration except for the case of 4 mol % Bi which may be attributed to the presence of large fraction of second phase and porous microstructure. For example, FIG. 9B shows the temperature dependence of magnetization for Li and Bi modified LSMO ceramics. Pure LSMO has Tc around ~300K, while the Tc for the samples doped with 6 mol % Li or Bi and 4 mol % Li is ~325K. As the dopant amount decreases to 2 mol%, the Curie temperature decreases to that of unmodified LSMO ceramics. An increase in the Curie temperature pertains to the fact that the smaller ion substitution takes place at A-site. This is a highly relevant result for the program showing the ability to tune the transition temperature all the way from 290K to 330K. In embodiments of the invention, it may be preferred for certain applications to be able to tune the materials to a desired Curie temperature by increasing or decreasing the Curie temperature of the ferromagnetic material (e.g., by introducing an appropriate amount and type of dopant) from about 5-50%, such as from about 10-25%, or from about 12-15% and so on.

As a result of the above examples, it has been determined that design considerations for MTGs of the invention can include miniaturizing the device without compromising magnetic force through shape demagnetization. Reduction in gap will increase the magnetic field acting on the ferromagnet, thereby increase the mechanical energy in the system. Similarly, decreasing the ferromagnet thickness will decrease the thermal inertia of the system, increasing the oscillation frequency. Secondly, inclusion of non-linear spring dynamics would provide a means to increase the mechanical energy of the system while simultaneous providing control of the temperature swings of the ferromagnet material.

In embodiments, practical and low cost hybrid PV/MTG panels can be made where the specific power of the MTG is at least 12 W/kg. This high specific power required for air and space vehicles ensures that if the cost can be low then the device can also address other applications such as terrestrial solar and waste heat. Meeting this goal for specific power will typically involve minimizing mass while maximizing device efficiency and power density.

For best overall device efficiency it is desirable to have efficient conversion of thermal energy to mechanical strain energy in the oscillator. The amount of strain energy is governed by the amount of magnetic force that can be generated so magnetic force should be maximized. Additionally, the mechanical oscillator's power is equal to the product of the strain energy and the oscillation frequency, so frequency should also be maximized.

Once the maximum mechanical power is captured, another objective can be to make the best use of that power with efficient conversion to electricity. This involves proper design of not only the piezoelectric/magnetostrictive laminate, but also the power conversion circuits needed to condition the power from AC to DC. In addition, the design should preferably account for fabrication constraints and cost goals.

Devices capable of meeting these goals include a TRL5 commercially viable hybrid energy harvesting panel that enhances photovoltaic cells with supplemental thermal harvesting from a MTG. The MTG device can address a myriad of application spaces. Modest tuning of constituent materials and geometries allows the MTG device to function as a thermal scavenger across a host of thermal gradients and temperature ranges. The arrayed nature of the MEMs scale device, coupled with an easily scalable manufacturing technique facilitates incorporation of the MTG device into practically any existing thermal gradient.

It has been found that the wide design space and many independent system parameters can be engineered to provide for optimal system level performance. In order to tune the various dependent and independent system variables, the operational constraints of the target application must be well defined a priori. For example, the design constraints for a terrestrial concentrated solar power farm are dramatically different than those required for solar aircraft applications. Furthermore, even within the field of solar aircraft particulars of HALE craft differ significantly from those of LTA craft in terms of irradiative flux, convective heat transfer, and cell efficiencies. Exemplary applications include photovoltaic systems for atmospheric or exoatmospheric flight, such as high efficiency multi-junction III-V systems (e.g. Spectrolab from Boeing, ATJ from Emcore), silicon based systems (e.g. Maxeon™ from SunPower), and lower-efficiency emergent systems (e.g. dye-sensitized, organic cell, quantum dots). Design considerations can also be tailored to flight conditions of the craft, which could range from lower altitude flight (20,000 ft), high altitude (65,000 ft), or exoatmospheric ranges.

Performance and Design Models.

Figure 27:
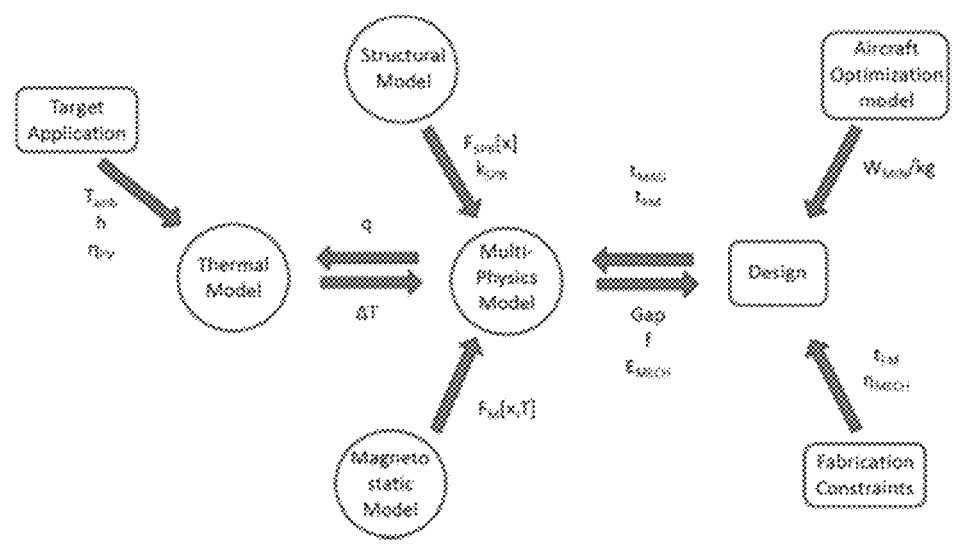
FIG. 27 is a schematic of a multicomponent, coupled model for a PV/MTG system.

Once selection of the target application has been made and appropriate system level boundary conditions and constraints are in place, the model subcomponents can be expanded and more intimately coupled. As shown in FIG. 27, the system-level multi-physics model features many subcomponents such as ANSYS finite element thermal and structural analysis, first-principles magnetostatic modeling, and a coupled, multiphysics finite difference system operation module. The suite of finite element analysis, finite difference, and closed form analytical models can be used to explore effects of material properties, geometry, and application space constraints on the performance of an integrated PV/MTG Hybrid Harvester System.

System input parameters that can be considered during modeling can include one or more of solar irradiation level, PV cell efficiency and specific power, ambient temperature, hot- and cold-side convection coefficients, soft and hard magnet material properties, geometry, and configuration, as well as spring mechanical properties.

Using the powerful arsenal of custom-written and commercial finite difference and finite element analysis suites, the physical design constraints and relative system input parameters can provide the framework for the coupled model to predict performance of the system. Furthermore, the output parameters of the various components of the coupled model serve as powerful aids in the determination of the applicability of the PV/MTG system in a wide range of applications. Modules of the multi-physics modeling suite can provide figures of merit for the system in terms of average thermal flux through the MTG, net efficiency of the integrated PV/MTG harvester, and specific power of the integrated system (W/kg or W/cm$^2$).

Macro-Scale Prototype and Power Conversion Circuits.

Figure 28:
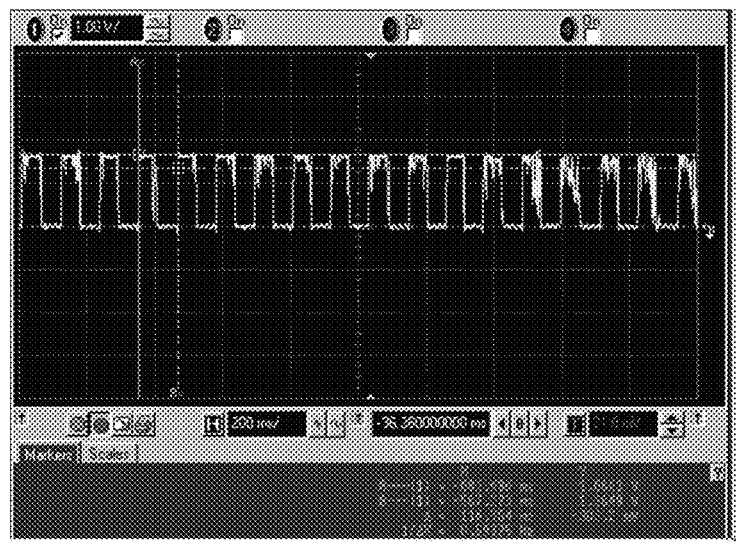
FIG. 28 is a graph showing electrical output of a MTG device of the invention.
Figure 33:
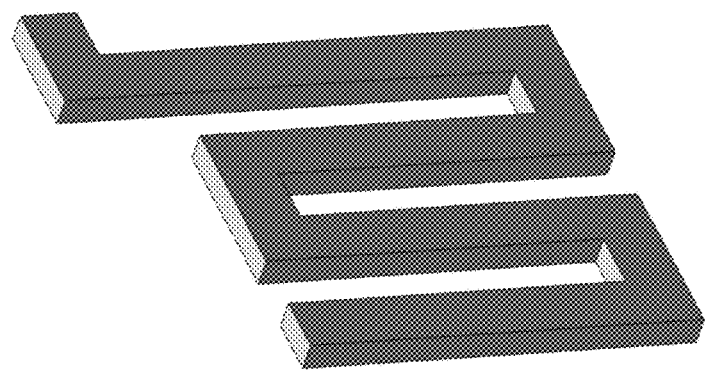
FIG. 33 is a schematic diagram of a representative zig-zag spring structure.

A macro scale harvester prototype can be designed to validate these models all the way from PV thermal input to conditioned electrical output. Reconciliation of empirical data provided through observation of a macro-scale device will allow for verification of model parameters and assumptions that will govern the ultimate design of the targeted PV/MTG harvester application. The device shown in FIG. 33A can be expanded to include PV integration, power conversion, power conditioning, and improved capabilities to validate multiphysics models all the way from PV thermal input to conditioned electrical output (FIG. 28).

Another important aspect of specific embodiments of the device is to provide efficient AC to DC power conversion. AC/DC rectifiers and regulators are well developed and simple circuits and a custom design may not be needed to achieve adequate efficiency. The in house board described below was designed to regulate DC power from a thermoelectric generator (TEG) and AC power from piezoelectric vibration harvesters. This is very similar to the case here of the PV (DC) and MTG (AC) hybrid panel.

Figure 29:
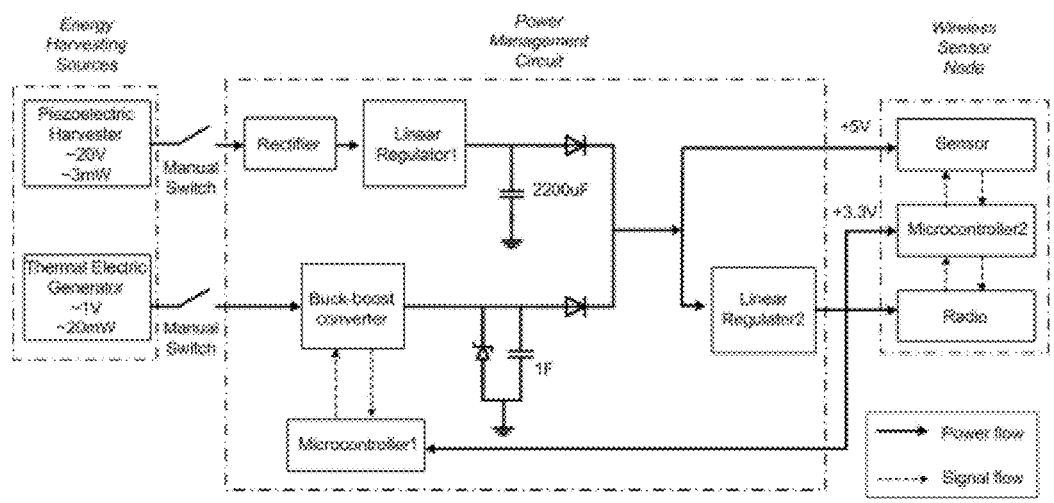
FIG. 29 is a diagram of a MTG system of the invention.
Figure 30A:
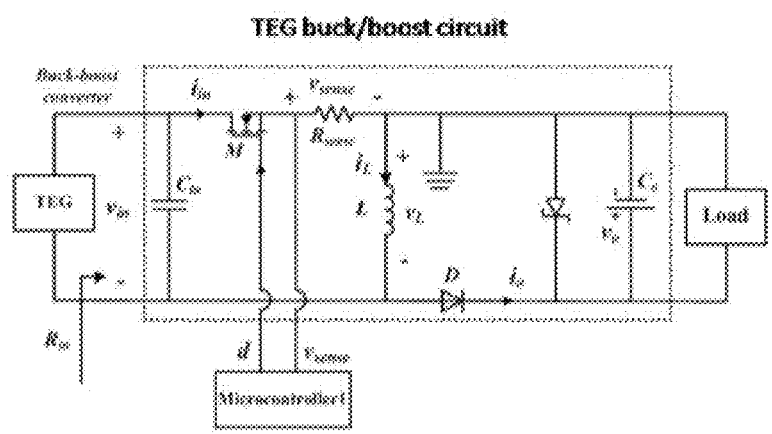
FIGS. 30A and 30B are respectively a diagram of a circuit for TEG energy harvesting (FIG. 30A—left) and waveforms during one switching period of the DCM (FIG. 30B—right).
Figure 30B:
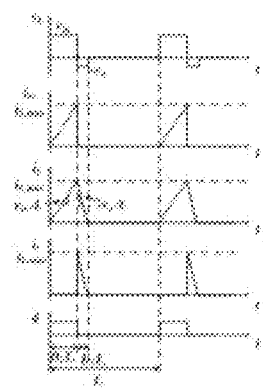

The system diagram shown in FIG. 29 consists of two energy harvesting sources (vibration and thermal), a power management circuit, and a wireless sensor node. For the piezoelectric energy harvester, the full-wave rectifier and linear regulator 1 was designed to regulate the output to 5 V DC. Linear regulator 2 was used for generating a stable 3.3 V DC from either source to power the microcontrollers and radio. After a stable 3.3 V voltage is obtained at the output of linear regulator 2, the microcontroller 1 generates a control signal for the buck-boost converter to harvest energy from the TEG. Microcontroller 2 may then perform sensing and data transmission. For the TEG, the buck-boost converter is run in discontinuous conduction mode (DCM) and is used to match the impedance and maximize power extraction. The power conversion circuit for the TEG is shown in FIGS. 30A and 30B along with waveforms from a switching cycle.

In addition to the fundamental aspects described above, the following particular details through design, fabrication, and testing can also be explored for the macro-scale prototype, including one or more of optimization of the magnetic circuit; force as a function of temperature of ferromagnet and separation distance between hard and soft magnet; processing issues inherent with SmCo materials; proper backing iron materials and thickness; incorporation of a hard magnetic-induced spring non-linearity; laser cut spring processing; incorporation of COTS PZT fibers onto springs; PZT electrodes and poling; an incorporated scaled magnetic circuit; use of SmCo or Nd magnets; incorporation of high efficiency solar cells; aluminum cold sink micro fin fabrication; validation of scaling relationships; providing for vacuum encapsulation; and testing of the device using solar heating and passive cooling (as opposed to actively controlled hot and cold sides).

Thermal Engineering of Various Embodiments of the System.

As demonstrated in FIG. 14, the optimal photovoltaic and cold side temperatures, and the resulting thermal gradient, are inherently dependent on both the specific photovoltaic cell operational parameters (e.g. material, efficiency at temperature, etc.) and on the specifics of the target application (e.g. ambient temperatures, average convections coefficients, etc.). See also Radziemska, E., "Performance Analysis of a Photovoltaic-Thermal Integrated System" International Journal of Photoenergy, Volume 2009 (2009), doi: 10.1155/2009/732093.

The first stage of the system design for an integrated PV/MTG harvester should therefore explore the requirements needed to ensure proper temperatures and thermal gradients across the thickness of the packaged panel. Final thermal designs should thus ensure optimal system performance of the coupled PV and MTG harvesters with the end goal of providing the optimal thermal conditions to balance the power generated from the MTG with the loss in efficiency associated with heating of the photovoltaic junction.

Magnetic Circuit Configuration.

One drawback associated with miniaturizing the device is that the magnetic force between the hard and soft magnets is increasingly diminished with decreasing aspect ratio. For reduced aspect ratio, both the hard and soft magnets will experience shape induced demagnetization. In order to overcome the shape demagnetization associated with the reduced aspect ratio for a through-thickness magnetization, the configuration of the magnetic components in the system can be altered from a through-thickness configuration to a magnetic circuit. For example, FIGS. 7B and 7C illustrate an exemplary configuration with the magnetic components operably configured into a set of antiparallel permanent magnets coupled with a backing shunt, which during use is expected to reorient the magnetic field into the plane of the ferromagnet, as opposed to a through-thickness configuration. It is noted that either configuration is possible for embodiments of the invention but that one may be preferred over the other for certain uses.

Reconfiguration of the magnetic components from a through-thickness to a circuit configuration strengthens the magnetic field through several mechanisms. First, altering the hard magnet geometry from a disk with a thickness to diameter ratio of 0.05 (D=2.5 mm, t=0.125 mm) to an aspect ratio of 0.15 (D=0.83 mm, t=0.125 mm) increases the permeance coefficient of the magnet from 0.1 to 0.34. The increased aspect ratio results in a nearly 300% increase in face strength of the magnet.

A similar and more dramatic effect can be obtained in the ferromagnet layer upon conversion to an in-plane magnetization (FIGS. 7B and 7C). Rotating the magnetization of the layer from the through-thickness configuration to an in-plane magnetization increases the permeance coefficient from 0.1 to roughly 17, effectively removing the shape demagnetization field completely. Such a shift in configuration allows for the use of film deposition techniques for synthesis of the ferromagnet layer of the MTG harvester.

Figure 31A:
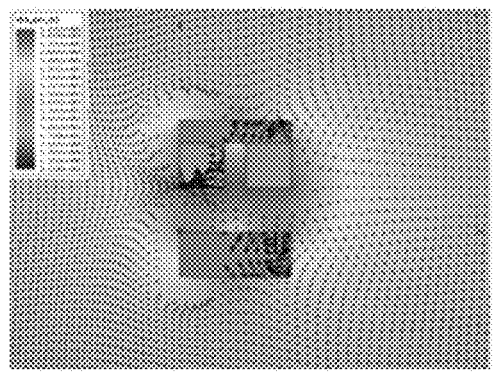
FIGS. 31A and 31B are diagrams showing FEA analysis of the magnetic field in close proximity to a magnetic circuit and a through-thickness orientation of similar geometries showing a dramatic concentration of magnetic energy within the circuit.
Figure 31B:
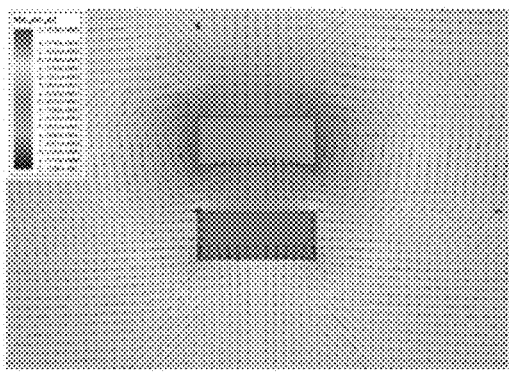

FIGS. 31A and 31B provide an FEA analysis of the magnetic field in close proximity to a magnetic circuit and a through-thickness orientation of similar geometries showing a dramatic concentration of magnetic energy within the circuit. As illustrated by the small area of red and orange in FIGS. 31A and 31B, the energy within the system is more localized to the area of the ferromagnet when arranged in a circuit configuration. Such energy concentration acts not only to maximize the magnetic energy within the hard magnets, but also to reduce interference of the magnetic field with other components in the PV/MTG system, or in the near proximity.

In design of the magnetic circuit configuration of the MTG device, both materials and orientation of the subcomponents can be engineered to provide for maximum performance.

Hot Side Hard Magnet Material Selection.

Prototypes of the invention and modeling have focused on NdFeCo systems. Rare-earth NdFeCo hard magnets are currently among the best performers in terms of magnetic energy. Furthermore, NdFeCo magnets are much cheaper than other commercially available hard magnets, yielding a more economical material—both in terms of dollars per kilogram and in terms of Tesla per dollar. One drawback with neodymium-based magnets as components of a miniaturized MTG hybrid energy harvester lies in the permeance properties of the NdFeCo materials. While the operational temperature of the device is expected to be well below the Curie temperature of many of the commercially available hard magnets (e.g. NdFeB, AlNiCo, SmCo), temperature-induced demagnetization remains a potential risk. The initial magnetic drive of the prototype featured an N42 NdFeCo disk magnet with a diameter of 9 mm and a length of 3 mm, equating to a permeance coefficient of 0.86. As such, the magnet experienced permanent demagnetization during prototype evaluation when the hot side temperature was raised above ~70° C.

A further reduced scale system shows the permeance coefficient of the thin disk hard magnet of the system is reduced by an order of magnitude, down to ~0.1. Even upon conversion of the system to a magnetic circuit configuration, the permeance coefficient lingers at a maximum of roughly 0.34. It is believed that any neodymium-based magnet of this geometry will start to show permanent demagnetization by roughly 25° C. (FIG. 8A and FIG. 8B). Although the hard magnet could potentially be remagnetized, such processes typically require annealing of samples in high magnetic fields.

Although slightly more expensive than and not quite as strong as NdFeCo (34 MGOe for SmCo versus 62 MGOe for NdFeCo), FIGS. 8A and 8B, a miniaturized SmCo-based magnetic circuit drive will retain its strength for hot-side temperatures approaching 400° C. The loss in maximum magnetic energy of the material is therefore compensated by an enhanced demagnetization resistance, thereby increasing the application space in terms of maximum operational temperatures for low aspect ratio components. Furthermore, SmCo materials are not susceptible to oxidation or atmospheric degradation, precluding requirements for coatings that would incur additional mass penalties.

Design of Nonlinear Spring.

Embodiments of the invention can benefit from the incorporation of springs with nonlinear characteristics. For simple linear spring dynamics, the hot and cold switching temperatures of the ferromagnet are defined by the spring constant, preload, and gap. Incorporation of a spring with a nonlinear deflection response decouples the critical switching temperatures from the gap spacing of the MTG. Such independence in parameters allow for a wider swing in hot and cold switching temperatures, thereby increasing the mechanical energy of the system as expressed by:

$$E_{Mech} = \int_0^{Gap} (F_{Cold} - F_{Hot}) dx$$

where $F_{Cold}$ and $F_{Hot}$ represent the magnetic force vs. distance relationship for the hot and cold ferromagnet critical switching temperatures. Depending on the shape of the spring deflection response curve, the nonlinearity might also act to increase the pressure between the hard and soft magnet. The rise in pressure acts to decrease the contact resistance, thus increasing the thermal flux across the interface. Preliminary modeling results indicate that incorporation of nonlinear spring dynamics has the potential to increase the mechanical energy in the system by an order of magnitude. For example, a comparison is provided in FIGS. 3A and 3B, where net force as a function of spacing and temperature for a linear spring configuration (FIG. 3A), and for a nonlinear spring configuration (FIG. 3B) are shown. The ferromagnet with the linear spring oscillated between 32° C. and 28° C., as defined by the spring constant (200 N/m), spring preload (1.36 mN), and gap (0.2 mm). For the nonlinear spring, the temperature oscillates between 32° C. and 4° C., the values of which are completely determined by spring design.

There are a variety of methods used to fabricate springs with nonlinear responses. While mechanical shallow curved arch springs or shape memory alloy (SMA) materials gave the potential to provide the required nonlinear characteristics, both come with significant difficulty in implementation. Shallow arch mechanical springs are fairly simple to model, but the structure is extremely sensitive to fabrication processes and material defects—the latter complication is even more pronounced for MEMs-scale devices. Shape memory alloy materials display nonlinear behavior through a thermally induced phase change. As such, implementation of SMA materials would require thermal transport through high resistance spring geometries, added significant thermal inertia. Although some embodiments of the invention may comprise a shape memory component, such as a shape memory alloy, preferred embodiments do not comprise a shape memory component.

Magnetostrictive Springs.

Magnetostriction is a ferroic order wherein materials exhibit a change in shape upon exposure to a magnetic field. Typically, the magnetostrictive effect is used to sense magnetic fields. Usually, magnetostrictive materials are coupled with other ferroic materials to produce a multiferroic behavior. In embodiments, a composite laminate spring can be used which comprises one or more magnetostrictive layers in combination with a piezoelectric layer. Preferred embodiments may comprise for example two magnetostrictive layers and a piezoelectric layer. The magnetostrictive materials used for the spring substrate will provide additional strain energy to the piezoelectric layer upon moving in and out of the magnetic field of the hard magnet during device oscillation.

A magnetostrictive material will provide the desired nonlinear spring response in one of two ways. As illustrated in FIG. 4A, a material with a positive magnetostriction coefficient (e.g., Metglas, galfenol) would tend to lengthen when the material approaches the magnetic field of the hard magnet (when the MTG is in the closed state). Such a lengthening would translate to an effective stiffening of the spring in the open state, increasing the mechanical energy in the system. A similar, but potentially more energetic, configuration could employ a laminate of several magnetostrictive materials with different coefficients (FIG. 4B). In the closed state, the magnetic field would cause one material to lengthen more than the other, causing a bending action in the laminate.

In embodiments, the design for the magnetoelectric springs can comprise layers of NZF, nickel, and PZT. The purpose of the dual magnetostrictive stack is to use the disparate magnetostriction coefficients to provide a prestress to the piezoelectric material, removing the need for magnetic bias. Proper orientation of the Ni/NZF stack and careful scaling of the relative thickness of each layer will provide a nonlinearity to the spring deflection curve, providing significant increase in mechanical energy. The degree of nonlinearity and total force of the springs will not only depend on relative magnetostrictive layer thickness, the geometry of the springs and difference in magnetostrictive coefficients, but also on the amplitude and variation of the magnetic field experienced during oscillation.

Proper design of the spring geometry and layer thicknesses should take into consideration one or more of the following: the amplitude and variation of the magnetic field in the vicinity of the magnetoelectric springs; the magnetic field at which the magnetostrictive effect of each layer saturates; and/or the tradeoff between mass, mechanical energy, and frequency of oscillation.

Fabrication of Composite Magnetoelectric (ME) Springs.

In embodiments, optimizing conversion of mechanical to electrical energy is key to achieving high specific power for MTG thermal backplane. Magnetostrictive/PZT laminates according to embodiments of the invention can comprise for example a multi-layer, such as a five layer structure, to harvest the energy. A representative design is shown in FIG. 32. There can be for example lead zirconate titinate (PZT) 2,4 and two magnetostrictive phases (nickel 3 and nickel zinc ferrite (NZF) 1,5) which will provide the needed structure for self-bias and broadband properties in the structure.

The structure harvests energy from a) piezo-electric effect and b) magneto-electric effect. Also, presence of two magnetostrictive materials such as Ni and NZF creates internal DC bias. Normally, ME (magnetoelectric) coefficient is maximum at some optimal HDC (DC magnetic bias), which usually is quite high. Research has shown self-biased effect that allows non-zero ME coefficient at HDC=0. It is thus believed that it is possible to bring the optimal ME coefficient in the working range (HDC≈0). Self-biased ME effect with pre-stressed PZT is expected to provide higher voltage outputs. The structure in FIG. 32 was initially selected based upon its potential for exhibiting low resonance frequencies. It is expected that the bending moments in the spring structures will be optimal to facilitate optimum energy harvesting.

To understand the nature of each magnetoelectric spring for low frequency energy harvesting, a model can be implemented for optimizing the dimensions. One goal could be to simulate the power generated from the spring (using a cantilever beam model) as the soft magnet (LSMO) oscillates between the hard magnet (Samarium) and the cold surface. A vibration model for cantilever beam can involve the application of Hamilton's principle and the minimization of the action of the system. The equation to be minimized can consist of kinetic, stretching, and piezoelectric components as given by:

$$\rho A \frac{\partial^2 w}{\partial t^2} + Y_1^E I_{22} \frac{\partial^4 w}{\partial x^4} - \frac{\partial^2}{\partial x^2}(b(x)\chi_s(x))V(t) = 0$$

Due to the demagnetization effect induced by the hard magnet, the above equation will be solved simultaneously with:

$$-(b(x)\chi_s(x))\frac{\partial^2 w}{\partial x^2} + \frac{A}{t_p^2} U_S^{33} V(t) = 0$$

where ρ is the density, is the Young's modulus, is the moment of interita, is the piezo characteristic function, the piezo thickness, and the displacement.

$$b(x) = e_{13}/t_p \left( \int_{t_s}^{(t_s+t_p)} l_w(x) z \, dA - \int_{-t_s}^{-(t_s+t_p)} l_w(x) z \, dA \right)$$

$$U_S^{33} = \epsilon_{33} - d_{31}^2 Y_1^E$$

Subject to boundary conditions, $$w(0, t) = 0, \left.\frac{\partial w(x, t)}{\partial x}\right|_{x=0} = 0$$

$$\mathbb{M}(L, t) = -J_{tip}\frac{\partial \ddot{w}_L}{\partial x}; \mathbb{V}(L, t) = F_{Mag}(t) - M_{tip}\ddot{w}_L$$

$$V(t) = -R_{Load}\dot{Q}; R_{Load} = \text{Load resistnace}, \dot{Q} = \text{current}$$

Magnetic force is calculated by, $$F_{mag}(w_L, t) = \int_{w_L - \frac{l_{Gd}}{2}}^{w_L + \frac{l_{Gd}}{2}} \rho_{Gd} A_{Gd} \sigma(z, T) B_{mag}(z) \, dz$$

Here, is sp. magnetization as function of temperature, is magnetic flux density generated by Nd. (Assuming parallelepiped geometry.)

$$B_{mag}(z) = \frac{B_{rNd}}{\pi}\left[\tan^{-1}\left(\frac{ab}{2x\sqrt{4x^2 + a^2 + b^2}}\right) + \tan^{-1}\left(\frac{ab}{2(x + l_{Nd})\sqrt{4(x + l_{Nd})^2 + a^2 + b^2}}\right)\right]$$

The power harvested is $P = V^2/R_{Load}$.

In parallel, a finite element model can also be developed for the magnetoelectric spring, with the aim to provide an object oriented simulation of the magnetic and electric fields in the device. The results obtained from finite element modeling can be used to enhance and validate the numerical approach. The finite model is expected to provide an analysis of clamping effects and a proper simulation of electrical/magnetic effects in different structural shapes.

Fabrication of the magnetoelectric spring structure can be fabricated through following two steps: laser micromachining of the nickel substrate and 3D printing of PZT and NZF bilayers, where the PZT layers are deposited on the nickel substrate while the NZF layers are deposited on top of the PZT layers. For example, the nickel substrate can be machined to the desired structure using an 830 nm CW fiber laser. Since nickel reacts exothermally with oxygen, argon can be used as the assist gas. The cutting pressure in this case can be less than 6 bar. For high pressure cutting, nitrogen can be used as the assist gas. The laser is expected to produce a bright pulsating beam which can cut through thin layers of nickel substrate with applied laser power of about 1 W. A 3D printer which utilizes the aerosol deposition can be used for depositing PZT bilayers on nickel substrate and NZF bilayers on PZT bilayers. The 3D printer is capable of printing materials with viscosity 0.7-1000 cP, and the typical deposition thickness is 2-50 µm. During the deposition process, the 3D printer utilizes a stage which moves in x- and y-directions, and a deposition tip (100 µm aperture) which moves in z-direction. Two broadly applicable atomization methods—Ultrasonic and Pneumatic—can be used to carry out the deposition of both PZT and NZF layers. The ultrasonic atomizer is more suitable for materials with low viscosity and atomic size while the pneumatic atomizer is suitable for thicker materials. It is expected that the use of 3D printing technology will reduce fabrication time and improve the quality of the fabricated springs beyond the capabilities of other techniques.

The process begins with a mist generator that atomizes a source material. Particles in the resulting aerosol stream are refined in a virtual impactor and the material stream is then aerodynamically focused using a flow guidance deposition head, which creates an annular flow of sheath gas to collimate the aerosol. The co-axial flow exits the flow guidance head through a nozzle directed at the substrate, which serves to focus the material stream to as small as a tenth of the size of the nozzle orifice (typically 100 µm). Patterning is accomplished by attaching the substrate to a computer-controlled platen, or by translating the flow guidance head while the substrate position remains fixed. The relatively large stand-off distance from the deposition head to the substrate allows accurate deposition on non-planar substrates, over existing structures, and into channels or vias. The deposited films can be laser-annealed in real-time to achieve desired phase, electromechanical and magnetic properties, and dimensionality. The challenges in deposition of ceramic films with desired stoichiometry may involve the synthesis of the deposition solution that contains powder with optimum size and morphology mixed with appropriate solvents and in-situ laser annealing. A 3D aerosol deposition system provides the ability to make 3D structures and replicate them in large arrays. It is noted that rheology of the depositing solution may be key in some embodiments to obtaining a desired structure and shape.

Transmission electron microscopy (TEM) and energy dispersive x-ray spectroscopy (EDAX) can be used to examine cross-sections of the interfaces between nickel and PZT to identify oxidation, diffusion of species, etc. through the interfaces. Microstructural characterization can be performed using FEI Titan 300 Scanning Transmission Electron Microscope to examine the grain and interface microstructure. The stoichiometric composition and chemical information can be studied using a Kratos AXIS 165 high performance multi-technique surface analysis.

Deposition of Soft Magnet with Controlled Curie Temperature.

For maximum power output from the MTG, it may be desired to maximize the mechanical power of the oscillator. This can be accomplished by maximizing the magnetic force and therefore the spring strain energy available for electrical conversion. Magnetic force in the MTG is partially governed by the saturation magnetism of the ferromagnet layer so maximizing this property is desired. Additionally, the MTG operating temperature is governed by the ferromagnet's Curie temperature so temperatures will be tuned to coincide with HALE environmental conditions, or approximately −10° C. up to 20° C.

Synthesis of LSMO can also be performed through layer by layer deposition using sol-gel technique in combination with 3D patterning. For example, the LSMO precursor can be synthesized from lanthanum nitrate [La(NO$_3$)$_3$6H$_2$O], strontium acetate [Sr(CH$_3$CO$_2$)$_2$], and manganese acetate [Mn(CH$_3$COO)$_2$4H$_2$O] solution with a molar ratio of La:Sr:Mn=1:1:2. The starting materials can be dissolved in 1,2-propanediol [CH$_3$CH(OH)CH$_2$OH] under stirring condition as a 0.3 M LSMO solution. A 10 vol % polyacrylic acid can be added to the solution to stabilize the LSMO solution. Formamide (HCONH$_2$) can be used as drying control agent to avoid cracks. The critical crystallization temperature depends on deposition method, growth rate, precursors, and the substrate conditions. Dopants shown in Table 2 can be explored for particular applications to identify the suitable combination of magnetization and Curie temperature. Various annealing techniques can also be used to achieve the variation in nanostructures and film density in the wide temperature. The deposited thin films can be characterized by X-ray diffraction (XRD) Cu Kα radiation to confirm the formation of the perovskite phase. The composition of films can be determined by energy detection analysis of X-rays and Rutherford backscattering (RBS). Magnetic properties of the sintered samples can be measured by using an alternating gradient force magnetometer (AGFM) and Quantum design physical property measurement system (PPMS) VSM as a function of field and temperature (10 K to 600 K). The conduction properties can also be measured.

TABLE 2

Ionic radii of various elements and their preferred lattice sites

| Ion | Ionic Radii (pm) | La-site | Mn-site |
|---|---|---|---|
| La$^{3+}$ | 117.2 | ✓ | |
| Sr$^{2+}$ | 132.0 | ✓ | |
| Li$^+$ | 90.0 | ✓ | |
| Bi$^{3+}$ | 117.0 | ✓ | |
| Mn$^{3+}$ | 72.0 | | ✓ |
| Cu$^{2+}$ | 87.0 | | ✓ |
| Nb$^{5+}$ | 78.0 | | ✓ |

Micro-Scale Prototype Fabrication/Integration to PV.

According to embodiments a multifunction support/heat sink structure can be fabricated to house the spring assembly, PV top plate structure, and provide adequate thermal sinking for heat flux through the device. Since a target application for the PV/MTG hybrid is to be in solar aircraft, either tropospheric or exoatmospheric, one of the predominant constraints against which fabrication processes can be vetted is the associated net mass penalty for incorporation. For commercialization of the MTG harvester technology according to embodiments of the invention, fabrication and construction techniques can also be developed such that they are easily amenable to large scale, automated production techniques.

Figure 34:
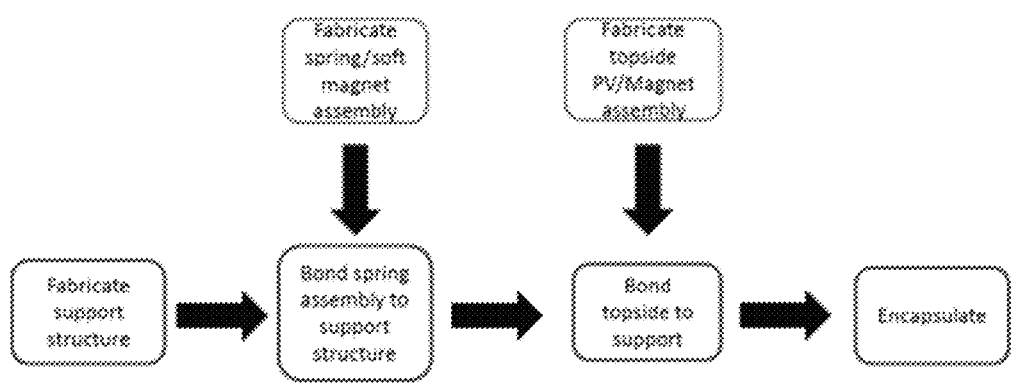
FIG. 34 is a schematic diagram of a method of manufacture for a PV/MTG device.

Incorporation of the hybrid harvester with a Photovoltaic cell (or array) includes two major subcomponents—a mechanical-to-electrical conversion spring assembly and a top plate composed of a thermal spreading layer and a permanent magnetic bias. Particulars of the spring/soft magnet assembly and topside PV/magnet bias are discussed in greater detail above. The focus of the integration effort described now is to demonstrate a method for the consolidation of the lessons learned to produce a packaged, integrated PV/MTG arrayed panel. For example the focus can be on the steps of support structure fabrication, assembly and bond of the springs to the support, bonding of the topside magnetic bias assembly, and final encapsulation of the arrayed panel. FIG. 34 provides a schematic diagram of a PV/MTG integration process flow.

In embodiments, it may be desired that the support structure of the integrated device not only provide for a stable mechanical platform upon which the harvester subcomponents rest, but also provide thermal sinking capabilities. Since both density and thermal conductivity are properties of the support structure, this unit may be preferably fabricated from aluminum. Fabrication of the support structure for example can feature several distinct fabrication techniques. The upper surface of the aluminum can be milled to create spring preload/thermal sink pedestals, topside stand-off pillars, as well as relief channels for any recesses required for springs, supplemental spring magnets, and spacer materials. The lower surface of the aluminum block can be designed to maximized thermal flux. In embodiments, a series of micro-scale fins (on the order of tens of microns in height and width) that will act to increase the convection coefficient on the backside of the MTG panel can be incorporated into the design. A coupled photolithographic/chemical etch process can be employed to fabricate such features.

For designs where the spring assembly calls for the nickel and NZF layers to act as electrodes for the piezoelectric layers, it is projected that the bond between the spring and the support plate may benefit from electrical isolation. Electrical isolation of the layer can be achieved through the use of a thin Kapton® sheet inserted between the two components, coated with an appropriate epoxy. Even though the voltage levels generated by the laminate springs are expected to be relatively low, Kapton® exhibits an extremely high breakdown voltage and will provide more than adequate electrical protection between the two. The epoxy selected should be such that it can provide for good mechanical stability over the temperature and humidity levels required for the targeted PV application. If desired, the polymeric bonding method used could also facilitate hermetic sealing.

The topside magnetic bias/PV cell can be configured to rest atop stand-off pillars machined into the upper surface of the aluminum backplate. The pillars can be designed to ensure the required gap between the hard and soft magnet layers. Between the top plate and the support structure, a thermally resistive foam spacer can be inserted to provide additional rigidity to the arrayed panel and act to reduce thermal bleed-through along the boundary of the array. Bonding of the topside plate can be accomplished using a silicone epoxy, similar to those used by others in the fabrication of solar panel arrays. The silicone adhesive allows for differing thermal expansion coefficients between the topside layers and the support pillars.

In embodiments, alternatively or in addition, a protective encapsulant can be applied to the upper surface of the panel. The encapsulant may be selected such that it protects the surface of the PV cells from mechanical damage during handling, installation, and use.

Test and Evaluation.

Embodiments of the invention can be tested and evaluated to determine feasibility for a particular application. For example, the TRL5 hybrid PV/MTG panel as described above can be evaluated using a one-sun Xenon arc lamp and a −73° C. capable Thermatron environmental test chamber. One goal of the testing and evaluation is to determine the effectiveness of the device by simulating the PV target environment aboard HALE aircraft at 65,000 ft where temperatures are approximately −55° C. and to evaluate performance of the hybrid panel. For illumination of the PV panel a Xenon arc lamp and collimating optics can be used to achieve a one sun intensity. Although the lamp is not as sophisticated as expensive solar simulators, it can provide a low cost solution for an approximate radiance profile and provide the needed thermal input to the hybrid panel. The hybrid PV/MTG panel can also be fabricated with embedded instrumentation for characterization of thermal profile, heat flux, oscillation frequency, and power generation. The power conversion circuit described above can be utilized and DC power out can be measured from both the PV and the MTG. Device efficiencies can be calculated and experiments will simulate the full operational envelope of hot and cold side temperatures and PV illumination levels. Additional tests can be performed to verify operation across a range of convection boundary conditions. At 65,000 ft the atmospheric pressure is less than 10% of what it is at sea level so convection coefficients are much lower for a given air speed. To this end the experimental apparatus should include provisions for blowing low pressure air (0.1 atm) across the PV surface at varying velocities to simulate a variety of potential panel installation scenarios.

Military Applications.

High Altitude Long Endurance (HALE) air vehicles, such as those being developed under the Air Force ISIS and DARPA Vulture programs are one military transition target for Hybrid Harvester technology. HALE platforms come in various shapes and sizes ranging from small hand-launched unmanned aerial systems (UAS's) such as the AF solar Raven to very large high aspect ratio aircraft such as NASA's Helios to Lighter than Air (LTA) vehicles such as the Air Force ISIS, Lockheed Martin's High Altitude Airship (HAA), or the Army's Long-Endurance Multi-Intelligence Vehicle (LEMV). One thing most of these vehicles have in common is that they will utilize solar cells to achieve long times on station. The PV/MTG Hybrid Harvester embodiments of the invention can be used to boost power generation and extend flight times for these next generation vehicles. Space-based military platforms in which more efficient and higher power-to-weight ratios are desirable, such as Cubesats and other military satellites used for communications and persistent surveillance, also offer an important transition area for Hybrid Harvester technology.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. Other embodiments of the invention will be apparent to those skilled in the art from consideration of the specification and practice of the invention. The description of the invention provided is merely exemplary in nature and, thus, variations that do not depart from the essence of the invention are intended to be within the scope of the invention. It is also noted that each reference cited in this specification, including published articles, published patent applications, patents, etc., is incorporated by reference herein in its entirety. Other references that may be considered useful in understanding the invention and which are incorporated by reference in their entireties include: http://www.electronenergy.com/products/neodymium-iron-boron-demagnetization-curves-N48.htm; Krylov, S., "Bistability of curved microbeams actuated by fringing electrostatic fields," Nonlinear Dynamics 66 (3) doi: 10.1007/s11071-011-0038-y; Huggins, C. R. and Hardingham, C. M., "Space and Industrial Markets for Photovoltaics," United Kingdom Department of Trade and Industry New and Renewable Energy Programme market report, 2000; Thilak, Adiboina, "Solar Photovoltaic (PV) Supply Chain-Global Market Size and Company Analysis of Polysilicon, Wafers, PV Cells and Solar PV Modules to 2015", RenewableEnergyWorld.com, 1 Feb. 2011; and Global Market Outlook for Photovoltaics Until 2014, European Photovoltaic Industry.

The invention claimed is:

1. A magneto-thermoelectric generator comprising:
  (a) one or more heat sink;
  (b) one or more magnetic circuit;
  (c) one or more temperature-dependent magnetic materials;
  (d) one or more piezoelectric material, and one or more structure capable of providing a non-linear restorative force, together provided as successive layers adjacent to one another;
  wherein, during use, the magnetic circuit is disposed proximal to or in operable communication with one or more heat source;
  wherein, during use, the heat source and the heat sink are capable of providing a thermal gradient with a hot side and a cold side;
  wherein, the temperature-dependent magnetic material (i) has a thermally induced magnetic transition point within or near temperatures included in the thermal gradient, and (ii) is in operable communication with the structure for providing a non-linear restorative force and the piezoelectric material;
  wherein, during use, the temperature-dependent magnetic material, the structure for providing a non-linear restorative force, and the piezoelectric material are capable of together oscillating between a closed position and an open position; and
  wherein, during use, said oscillations are capable of providing mechanical energy to the piezoelectric material, resulting in conversion of the mechanical energy to electrical energy.

2. The magneto-thermoelectric generator of claim 1, wherein, during use, the oscillating between a closed position and an open position occurs by:
  (a) magnetic attraction between the temperature-dependent magnetic material and the magnetic circuit at temperatures below the magnetic transition point of the temperature-dependent magnetic material to achieve a closed position; and
  (b) a loss of the magnetic attraction at temperatures above the magnetic transition point of the temperature-dependent magnetic material, which, in combination with a restorative force provided by the structure for providing a non-linear restorative force, achieve an open position.

3. The magneto-thermoelectric generator of claim 1, which does not comprise a shape memory component.

4. The magneto-thermoelectric generator of claim 1, wherein the heat source is a waste thermal energy source.

5. The magneto-thermoelectric generator of claim 4, wherein the thermal energy source is a photovoltaic cell.

6. The magneto-thermoelectric generator of claim 1, wherein the magnetic circuit comprises one or more of NdFeCo, NdFeB, AlNiCo or SmCo.

7. The magneto-thermoelectric generator of claim 1, wherein the temperature-dependent magnetic material comprises one or more of gadolinium, thin-film $La_{1-x}Sr_xMnO_3$ (LSMO) ceramics, powdered cobalt-rich metallic glasses, Fe—Ni, Non-Oriented Si—Fe, MnZnFeO, $Gd_5(Si_xGe_{1-x})_4$, $Gd_5(Si_{1.985}Ge_{1.985}Ga_{0.03})2$, $Ni_{52.6}Mn_{23.1}Ga_{24.5}MnAs$, $MnAs_{0.9}Sb_{0.1}$, $MnFeP_{0.45}As_{0.35}$, or $La_{1-x}Ca_xMnO_3$, $La_xM_ySr_{0.2}MnO_3$ (LSMO).

8. The magneto-thermoelectric generator of claim 7, wherein the temperature-dependent magnetic material is synthesized through thin-film deposition.

9. The magneto-thermoelectric generator of claim 1, wherein the structure for providing a non-linear restorative force is a ferrous spring or a magnetoelectric spring.

10. The magneto-thermoelectric generator of claim 9, wherein the magnetoelectric spring comprises one or more magnetostrictive layers.

11. The magneto-thermoelectric generator of claim 10, wherein the magnetoelectric spring comprises a single magnetostrictive layer with a positive magnetostriction coefficient.

12. The magneto-thermoelectric generator of claim 10, wherein the magnetoelectric spring comprises a laminate of magnetostrictive layers with one or more different magnetostrictive coefficients.

13. The magneto-thermoelectric generator of claim 10, wherein the magnetostrictive layer(s) of the magnetoelectric spring comprise(s) nickel-zinc ferrite (NZF) and nickel.

14. The magneto-thermoelectric generator of claim 10, wherein the magnetostrictive layer(s) of the magnetoelectric spring comprise(s) one or more of terbium (Te), dysprosium (Dy), terbium-iron-dysprosium, gallium-iron, iron, or iron alloy(s).

15. The magneto-thermoelectric generator of claim 10, wherein the piezoelectric material is applied to the one or more magnetostrictive layers.

16. The magneto-thermoelectric generator of claim 15, wherein the piezoelectric material is applied through spin coating or 3-D aerosol jet deposition.

17. The magneto-thermoelectric generator of claim 15, wherein the piezoelectric material is a lead ceramic.

18. The magneto-thermoelectric generator of claim 15, wherein the lead ceramic is any or any combination of PZT, PLZT, PMNT, PMNZ, and PFW.

19. The magneto-thermoelectric generator of claim 18, wherein the lead ceramic is PZT.

20. The magneto-thermoelectric generator of claim 15, wherein the piezoelectric material is any or any combination of barium titanate, potassium niobate, lithium niobate, lithium tantalate, sodium tungstate, PVDF and PVC.

21. The magneto-thermoelectric generator of claim 5, wherein a heat spreader layer is provided between the photovoltaic cell and the magnetic circuit.

22. The magneto-thermoelectric generator of claim 1, wherein a backside non-linear return circuit is provided between the structure capable of providing a non-linear restorative force and the heat sink.

23. The magneto-thermoelectric generator of claim 1, wherein the structure for providing a non-linear restorative force is disposed between the piezoelectric material and the temperature-dependent magnetic material.

24. A method of converting mechanical energy to electrical energy comprising:
(1) providing one or more magneto-thermoelectric generator comprising:
 (a) one or more heat sink;
 (b) one or more magnetic circuit;
 (c) one or more temperature-dependent magnetic materials; and
 (d) one or more piezoelectric material, and one or more structure capable of providing a non-linear restorative force, together provided as successive layers adjacent to one another; wherein, during use, the magnetic circuit is disposed proximal to or in operable communication with one or more heat source;
wherein, during use, the heat source and the heat sink are capable of providing a thermal gradient with a hot side and a cold side;
wherein, the temperature-dependent magnetic material (i) has a thermally induced magnetic transition point within or near temperatures included in the thermal gradient, and (ii) is in operable communication with the structure for providing a non-linear restorative force and the piezoelectric material;
wherein, during use, the temperature-dependent magnetic material, the structure for providing a non-linear restorative force, and the piezoelectric material are capable of together oscillating between a closed position and an open position; and
wherein, during use, said oscillations are capable of providing mechanical energy to the piezoelectric material, resulting in conversion of the mechanical energy to electrical energy; and
(2) using the generator to convert thermal energy into electrical energy.

25. The method of claim 24 comprising installing the magneto-thermoelectric generator proximal to or in operable communication with one or more photovoltaic cell.

26. The method of claim 24 comprising using the generator to convert thermal energy into electrical energy during use of a solar aircraft or solar farm.

27. The method of claim 26 comprising using the magneto-thermoelectric generator during flight of the solar aircraft to convert waste heat from the one or more photovoltaic cell to electrical energy.

28. The method of claim 26 comprising using the magneto-thermoelectric generator during use of the solar farm to convert waste heat from the one or more photovoltaic cell to electrical energy.

* * * * *